United States Patent [19]

Mihara et al.

[11] Patent Number: 5,541,870
[45] Date of Patent: Jul. 30, 1996

[54] FERROELECTRIC MEMORY AND NON-VOLATILE MEMORY CELL FOR SAME

[75] Inventors: Takashi Mihara, Saitama Pref.; Hitoshi Watanabe, Tokyo; Hiroyuki Yoshimori, Kanagawa Pref., all of Japan; Carlos A. Paz de Araujo; Larry D. McMillan, both of Colorado Springs, Colo.

[73] Assignees: Symetrix Corporation, Colorado Springs, Colo.; Olympus Optical Co., Ltd., Tokyo, Japan

[21] Appl. No.: 330,989

[22] Filed: Oct. 28, 1994

[51] Int. Cl.⁶ ............................................. G11C 11/22
[52] U.S. Cl. ........................................ 365/145; 257/295
[58] Field of Search ................................. 365/145, 149, 365/117; 257/295

[56] References Cited

U.S. PATENT DOCUMENTS

| | | | |
|---|---|---|---|
| 2,791,760 | 5/1957 | Ross | 340/173 |
| 2,791,761 | 5/1957 | Morton | 340/173 |
| 3,132,326 | 5/1964 | Crownover | 340/173.2 |
| 3,832,700 | 8/1974 | Wu et al. | 340/173.2 |
| 4,161,038 | 7/1979 | Wu | 365/145 |
| 4,888,630 | 12/1989 | Paterson | 357/23.5 |
| 4,888,733 | 12/1989 | Mobley | 365/145 |
| 4,893,272 | 1/1990 | Eaton, Jr. et al. | 365/145 |
| 4,910,708 | 3/1990 | Eaton, Jr. et al. | 365/145 |
| 5,038,323 | 8/1991 | Schwee | 365/145 |
| 5,046,043 | 9/1991 | Miller et al. | 365/145 |
| 5,309,393 | 5/1994 | Ootsuka | 365/145 |

FOREIGN PATENT DOCUMENTS 5-90532  4/1993  Japan ........................... H01L 27/108

OTHER PUBLICATIONS

Carlos A. Paz de Araujo, et al.; Integrated Ferroelectrics; Ferroelectrics 1991; vol. 116 pp. 215–228.
P. Arnett; Ferroelectric FET Device; Feb. 1973; IBM Technical Discolsure Bulletin; vol. 115, No. 9.

*Primary Examiner*—David C. Nelms
*Assistant Examiner*—Son Mai
*Attorney, Agent, or Firm*—Duft, Graziano & Forest

[57] ABSTRACT

A non-volatile integrated circuit memory in which the memory cell includes a first transistor gate overlying a first channel region, a ferroelectric material overlying a second channel region, and a second transistor gate overlying a third channel region. The channel regions are connected in series, and preferably are contiguous portions of a single semiconducting channel. The firm channel is connected to a plate voltage that is 20% to 50% of the coercive voltage of the ferroelectric material. A sense amplifier is connected to the third channel region via a bit line. The rise of the bit line after reading a logic "1" state of the cell is prevented from disturbing the ferroelectric material by shutting off the third channel before the sense amplifier rises.

41 Claims, 9 Drawing Sheets

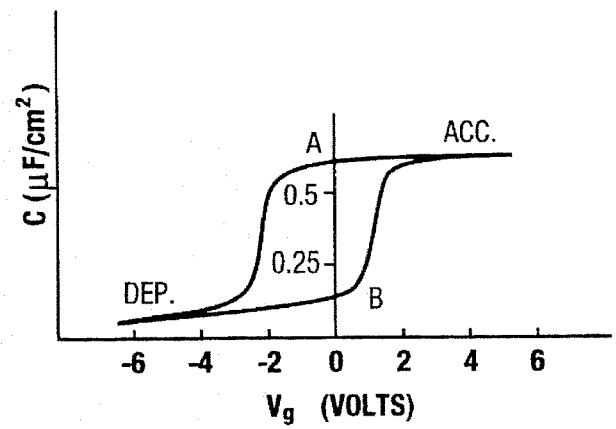
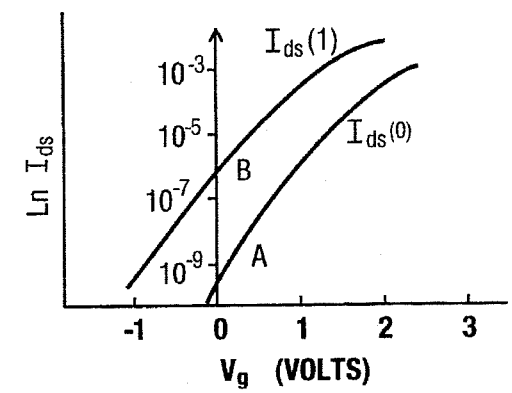
FIG. 4  FIG. 5
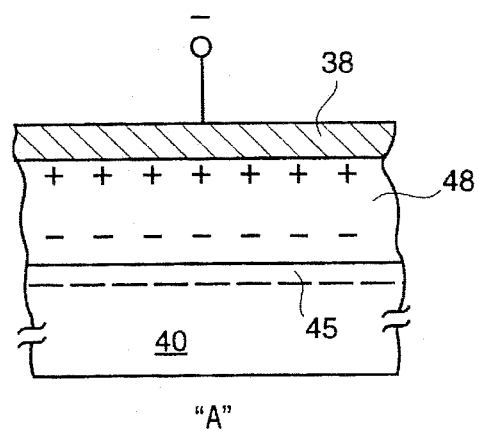
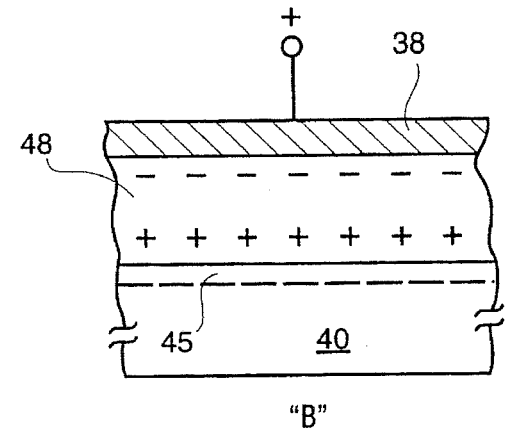
"A"  "B"
FIG. 6  FIG. 7
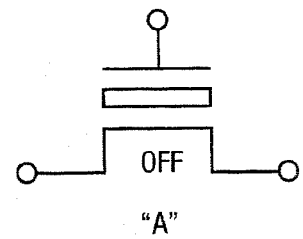
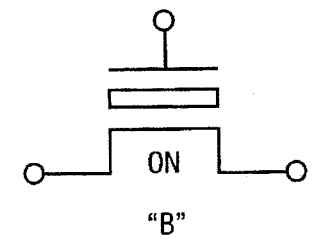
"A"  "B"
FIG. 8  FIG. 9

WRITE "1"

WRITE "0"

WRITE NON-SELECT

"1"

"0"

UNSELECTED

READ

READ UNSELECTED

FERROELECTRIC MEMORY AND NON-VOLATILE MEMORY CELL FOR SAME

BACKGROUND OF THE INVENTION

1. Field of the Invention

The invention in general relates to the structure and fabrication non-volatile integrated circuit memories and more particularly to a non-volatile memory including ferroelectric components.

2. Statement of the Problem

The lowest cost, highest capacity integrated circuit memories, such as DRAMs, are volatile memories; that is, information stored in the memories remains only so long as power is applied to the integrated circuit. Currently available non-volatile memories, such as EPROMS or flash-type memories, are relatively costly, have relatively low storage density, require high voltage applied for long periods to write and erase data, and generally have a more limited erase and write lifetime than DRAMs.

It has long been recognized that ferroelectric materials have polarization states that can be selected or switched by application of an electric field, and that these polarization states remain after the electric field is removed. It is well-known that if a ferroelectric capacitor is substituted for the conventional silicon dioxide dielectric capacitor in the DRAM, instead of simply storing a charge that leaks off quickly, the capacitor can be switched between selected polarization states that will remain indefinitely after power is removed. Thus ferroelectric materials offer the possibility of simple, low cost, high density, non-volatile memories. Further, lowest cost, high, capacity memories such as conventional DRAMs, are susceptible to damage or alteration of their states from radiation, while ferroelectric materials are highly resistant to radiation damage and that their ferroelectric states are highly resistant to being altered by radiation. In addition ferroelectric memories do not need high voltage for writing or erasing, and can be written to or erased as fast as conventional memories can be read. Thus, considerable research and development has been directed toward the design and manufacture of an integrated circuit memory utilizing the switchable property of ferroelectric materials. See, for example, U.S. Pat. Nos. 2,791,760 issued to I. M. Ross, 2,791,761 issued to J. A. Morton, 5,038,323 issued to Leonard J. Schwee, 3,832,700 issued to Shu-Yau Wu and Maurice Hubert Franncombe, 4,161,038 issued to Shu-Yau Wu, 4,888,630 issued to James L. Paterson, 5,046,043 issued to William D. Miller, Joseph T. Evans, Wayne I,. Kinney, and William H. Shepherd, 4,888,733 issued to Kenneth J. Mobley, 4,910,708 issued to S. Sheffield Eaton, Jr., and 4,893,272 issued to S. Sheffield Eaton, Jr., Douglas Butler, and Michael Parris, Japanese patent application No. 3-247714, and the articles "Ferroelectric Field Effect Device" by P. Arnett in IBM Technical Disclosure Bulletin, Vol. 15, No. 9, p. 2825 (February 1973), and "Integrated Ferroelectrics" by J. F. Scott, C. A. Paz De Araujo, and L. D. McMillan in Condensed Matter News, Vol. 1, No. 3, 1992, pp. 16–20, (1991). However, such devices have remained essentially theoretical possibilities or research prototypes, since they have not been able to retain programmed threshold voltage levels for periods of time sufficient for commercial applications. A major problem that has limited such memories is the fact that all of the low-voltage memories that have worked at all are destructive read-out (DRO) memories, which results in the individual memory cell being switched each time it is read. Such memories cells therefore are subject to large amounts of switching. Since, up to the time of the present invention, the conventional ferroelectrics used in memories have been susceptible to fatigue, i.e. a loss of polarizability and other properties necessary for memory function after a moderate amount of switching. Further, all ferroelectric memories up to now have been susceptible to what has been called the "half-select" phenomenon or the accumulation effect; i.e. disturbance pulses much less than the coercive voltage are cummulative such that a finite number of disturbance pulse of voltages much less than the coercive voltage will eventually switch most ferroelectrics. See U.S. Pat. No. 3,132,326 issued to Joseh W. Crownover. Thus, domain switching of cells that are not selected occurs far too often for a reliable memory. For these reasons, no practical, low-voltage, non-volatile memory is yet available.

3. Solution to the problem:

The present invention solves the above problem by providing a ferroelectric non-volatile, non-destructive readout (NDRO) memory that requires a relatively small voltage, on the order of two volts to five volts, to switch.

The non-volatile, NDRO memory according to the invention comprises a semiconducting channel region in which the current flow is determined by the polarization state of a ferroelectric material. This "ferroelectric" channel region is connected in series between two channel regions in which the current flow is controlled by a transistor gate means. Preferably, the three channel regions are connected between a plate voltage and a bit line, so that the voltage level of the bit line is determined by the polarization state of the ferroelectric material. Preferably, the three channel regions are contiguous portions of a single channel region doped with a first dopant and sandwiched between a pair of active areas doped with a second dopant type. Or the three channel regions may be the channels of two MOS transistors and a ferroelectric FET, which MOS transistors and ferroelectric FET are connected in series, with the ferroelectric FET between the two MOS transistors. Since the portion of the memory that stores information is ferroelectric, the memory can be programmed with low voltages.

The invention provides a memory cell for a non-volatile integrated circuit memory, the memory cell comprising: first transistor means, including a first semiconducting channel region, for effecting transistor action in the first semiconducting channel region to control current flow through the first semiconducting channel region; ferroelectric transistor means, including a second semiconducting channel region, for effecting transistor action in the second semiconducting channel region to control current flow through the second semiconducting channel region, the ferroelectric means further including a ferroelectric material capable of existing in a first polarization state and a second polarization state and a ferroelectric gate means for controlling the polarization state of the ferroelectric material; and second transistor means, including a third semiconducting channel region, for effecting transistor action in the third semiconducting channel region to control current flow through the third semiconducting channel region; wherein the first, second, and third semiconducting channel regions are connected in series. Preferably, the first, second and third channel regions are contiguous portions of a single semiconducting channel region. Preferably, the first transistor means further comprises a first transistor gate and the second transistor means further comprises a second transistor gate. Preferably, the ferroelectric material overlies at least a portion of the first transistor gate and the second transistor gate. In one embodiment the memory further includes an isolation layer between the ferroelectric material and the first transistor gate and between the ferroelectric material and the second transistor gate. In another embodiment, the ferroelectric material directly contacts the first transistor gate and the second transistor gate.

In another aspect, the invention provides a ferroelectric memory device comprising: a substrate, a channel region in the substrate, a first conducting gate overlying at least a first portion of the channel region, a second conducting gate overlying at least a second portion of the channel region, a ferroelectric material overlying at least a third portion of the channel region between the first and second conducting gates, and a ferroelectric gate overlying at least a portion of the ferroelectric material.

In a third aspect, the invention provides a non-volatile integrated circuit memory comprising a plurality of bit lines, a plurality of word lines, a plurality of memory cells, a source of a plate voltage, row address means for applying signals to selected ones of the memory cells via the word lines, column address means for applying signals to selected ones of the memory cells via the bit lines, and data in/out means for applying data signals to and receiving data signals from the memory cells, each memory cell comprising: first transistor means, including a first semiconducting channel region, for effecting transistor action in the first semiconducting channel region to control current flow through the first semiconducting channel region; ferroelectric transistor means, including a second semiconducting channel region, for effecting transistor action in the second semiconducting channel region to control current flow through the second semiconducting channel region, the ferroelectric transistor means further including a ferroelectric material capable of existing in a first polarization state and a second polarization state and a ferroelectric gate means for controlling the polarization state of the ferroelectric material; and second transistor means, including a third semiconducting channel region, for effecting transistor action in the third semiconducting channel region to control current flow through the third semiconducting channel region; wherein the first, second, and third semiconducting channel regions are connected in series, each one of the word lines is electrically connected to the first transistor means and the second transistor means in one of the memory cells, the source of a plate voltage is electrically connected to the first semiconducting channel region in each of the memory cells, and each one of the bit lines is electrically connected to the third semiconducting channel in one of the memory cells. Preferably, the memory further includes a sense amplifier electrically connectable to at least one of the bit lines, and a source of a reference voltage electrically connected to the sense amplifier, and the reference voltage is less than the plate voltage. Preferably, the plate voltage is from 20% to 50% of the coercive voltage of the ferroelectric material. Preferably, the plate voltage is 0.5 volts or less.

In a further aspect, the invention provides a memory cell for a non-volatile integrated circuit memory, the memory cell comprising: a first pass gate transistor; a second pass gate transistor; and a ferroelectric transistor electrically connected between the first pass gate transistor and the second pass gate transistor. Preferably, each of the pass gate transistors include a first source/drain and a second source/drain, and the ferroelectric transistor is electrically connected between one of the source/drains of the first pass gate transistor and one of the source/drains of the second pass gate transistor.

The invention also provides a method of fabricating a ferroelectric memory, the method comprising the steps of: providing a substrate; forming a first gate insulator on the substrate; forming a first transistor gate and a second transistor gate overlying the first gate insulator; forming a ferroelectric transistor between the first transistor gate and the second transistor gate. Preferably, the step of forming a ferroelectric transistor comprises self-aligning the ferroelectric FET between the first and second transistor gates. Preferably, the method further includes the step of forming at least one source/drain adjacent the first transistor gate utilizing a self-aligned process and forming at least one source/drain adjacent the second transistor gate using self-aligned process. Preferably, the step of forming a ferroelectric transistor comprises the steps of: forming a hole in the first gate insulator between the first transistor gate and the second transistor; and depositing a ferroelectric material in the hole.

In yet another aspect, the invention provides a method of reading a ferroelectric memory, the memory including a ferroelectric device having at least first and second terminals, the method comprising: applying to the first terminal a voltage of a value equal to 50% or less of the coercive voltage of the ferroelectric device; and sensing the signal on the second terminal and providing an output signal corresponding to the state of the ferroelectric device. Preferably, the memory further comprises a bit line and the step of sensing comprises the steps of: connecting the second terminal to the bit line; and sensing the signal on the bit line and providing an output signal corresponding to the state of the ferroelectric device. Preferably, the step of applying comprises applying to the first terminal a voltage a value between 20% and 50% of the coercive voltage, which most preferably is a voltage of 0.5 volts or less.

In still a further aspect, the invention provides a method of programming a ferroelectric memory, the memory comprising a plurality of memory cells each cell comprising a ferroelectric material capable of existing in a first polarization state corresponding to a logic "1" and a second polarization state corresponding to a logic "0", the method comprising: polarizing all cells into the logic "1" state; then polarizing selected cells into the logic "0" state. Preferably, each of the memory cells comprises a ferroelectric device including the ferroelectric material, a ferroelectric gate, a first source/drain, and a second source/drain, and the step of polarizing all cells to a logic "1" state comprises forcing the source and drain to a low voltage and forcing the ferroelectric gate to a high voltage. Preferably, the ferroelectric device further includes a first transistor gate and a second transistor gate, and the step of polarizing all cells to a logic "1" state comprises forcing the first and second gates to the high voltage. Preferably, each of the memory cells comprises a ferroelectric device including the ferroelectric material, a ferroelectric gate, a first source/drain, and a second source/drain, and the step of polarizing selected cells into a logic "0" state comprises forcing the source and drain to a high voltage and forcing the ferroelectric gate to a low voltage. Preferably, the ferroelectric device further includes a first transistor gate and a second transistor gate, and the step of polarizing all cells to a logic "0" state comprises forcing the first and second gates to the high voltage.

The invention also provides a method of programming a ferroelectric memory device, the device comprising a substrate, a channel region in the substrate, first conducting gate overlying the channel region, a second conducting gate overlying the channel region, a ferroelectric material overlying the channel region between the first and second conducting gates, the ferroelectric device capable of existing in first and second logic states, and a ferroelectric gate overlying the ferroelectric material, the method comprising the steps of: applying a first voltage to the ferroelectric gate; applying a second voltage to the first and second conducting gates to modify the electric field in the channel region and cause partial domain inversion in the ferroelectric material; and continuing to apply the first and second voltages to cause the area of modified electric field to broaden in the channel, thereby causing positive feedback to cause more of the domains in the ferroelectric material to invert, thereby rapidly changing the logic state of the ferroelectric material. Preferably, the first voltage is a "low" voltage and the second voltage is a "high" voltage.

In a further aspect, the invention also provides a method of reading a ferroelectric memory, the memory comprising a memory cell including a ferroelectric device capable of existing in a first logic state and a second logic state, a bit line, and a sense amplifier, the method comprising the steps of: connecting the ferroelectric device to the bit line; allowing the bit line to assume a voltage determined by the logic state of the ferroelectric device; disconnecting the bit line from the ferroelectric device; then connecting the bit line to the sense amplifier.

In a final aspect, the invention provides a ferroelectric memory comprising: a memory cell including a ferroelectric device capable of existing in a first logic state and a second logic state; a bit line; a sense amplifier; first connecting means for electrically connecting the ferroelectric device to the bit line; second connecting means for electrically connecting the bit line to the sense amplifier; and timing means connected to the first and second connecting means for: causing the first connecting means to connect the ferroelectric device to the bit line for a sufficient time to allow the bit line to assume a first voltage determined by the logic state of the ferroelectric device, causing the second connecting means to connect the sense amplifier to the bit line, and causing the first connecting means to disconnect the ferroelectric device from the bit line before the sense amplifier drives the bit line to a second voltage indicative of the logic state of the ferroelectric device. Preferably, the first connecting means comprises a transistor means and the first voltage has a value of less than 50% of the coercive voltage of the ferroelectric device. Preferably, the first voltage is 0.5 volts or less.

Since the information stored in the memory according to the invention is not destroyed when the memory is read, the memory is seldom switched. Moreover, since the voltage applied when the cell is read is very low, the "half-select" phenomenon does not occur, that is, the state of the cell is not disturbed by the reading process. Thus fatigue due to switching and erroneous selection does not occur. Thus, the invention provides a unique memory, i.e. a non-volatile memory that can be programmed with low voltages and does not fatigue. Numerous other features, objects and advantages of the invention will become apparent from the following description when read in conjunction with the accompanying drawings.

BRIEF DESCRIPTION OF THE DRAWINGS

FIG. 4 is a graph of the capacitance versus gate voltage of the ferroelectric device in the memory cell of FIG. 2;

FIG. 5 is a graph of the channel current versus gate voltage of the ferroelectric device of the embodiment of FIG. 2;

FIG. 6 shows a portion of the cross-section of FIG. 2 illustrating the polarization charge when the memory cell is in polarization state "A";

FIG. 7 shows a portion of the cross-section of FIG. 2 illustrating the polarization charge when the memory cell is in polarization state "B";

FIG. 8 is a schematic representation of the ferroelectric device of the embodiment of FIG. 2 in state "A" which is designated the OFF state;

FIG. 9 is a schematic representation of the ferroelectric device of the embodiment of FIG. 2 in state "B" which is designated the ON state;

DESCRIPTION OF THE PREFERRED EMBODIMENT

Figure 1:
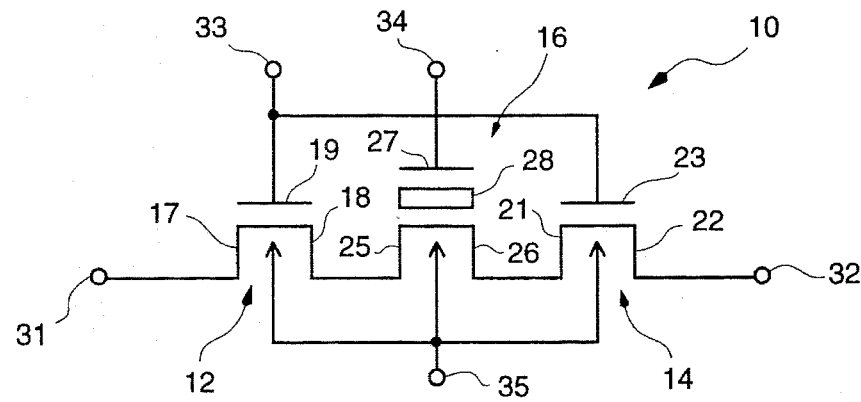
FIG. 1 is an electrical circuit diagram of an exemplary embodiment of a non-volatile memory cell according to the invention.

FIG. 1 is a circuit diagram of a memory cell 10 according to the invention having first pass gate transistor 12, second pass gate transistor 14, and a ferroelectric transistor 16. First transistor 12 includes a first source/drain 17, a second source/drain 18, and a gate 19. Second transistor 14 includes a first source/drain 21, a second source/drain 22, and a gate 23. Ferroelectric transistor 16 includes a first source/drain 25, a second source/drain 26, and a gate 27. The ferroelectric nature of transistor 16 is indicated by a rectangle which represents the ferroelectric material 28. Terminals 31, 32, 33, 34, and 35 connect to source/drain 17, source drain 22, gates 19 and 23, gate 27 and the integrated circuit substrate (not shown in FIG. 1) respectively. These terminals represent conductors, such as metalization wiring portions 61, 62 (FIG. 2) in the integrated circuit implementation of memory 10. Ferroelectric transistor 16 is similar to a MOS transistor, except that the gate insulator in the transistor is replaced by a ferroelectric material 28. As is known in that art, transistors 12 and 14 are referred to as "pass gate" transistors because they either permit signals applied to terminals 31 and 32 to pass and be applied across ferroelectric transistor 16 or prevent the application of such signals; that is the pass gate transistors 12 and 14 gate the signals applied to their source/drains, allowing them either to pass or not pass depending on the signal applied to terminal 33. As is known in the art, ferroelectric material 28 can assume either of two polarization states. As will be described in detail below, the polarization state of ferroelectric material 28 is determined by the relative voltages applied to gate 27 via terminal 34 and source/drains 25 and 26 via terminals 31 and 32 and pass gate transistors 12 and 14. In the embodiments described herein, terminal 35 can be considered to be a ground.

The memory 10 may be implemented in an integrated circuit as shown by the circuit of FIG. 1; that is, transistors 12 and 14 may be implemented as separate and distinct PMOS, NMOS, or bipolar transistors, each transistor having a pair of source/drains or emitter/collectors as the case may be, and transistor 16 may be implemented as a ferroelectric FET with a pair of source/drains separate and distinct from the source/drains-collector/emitters of transistors 12 and 14. However, one aspect of the invention is the fact that the memory 11 was implemented as shown in FIGS. 2 and 3.

In this disclosure, the term "source/drain" has a broader definition than in the art in general: it is intended to mean either the input or output terminal of any integrated circuit switching device that includes an input terminal, and output terminal, and a control terminal. Thus source/drain can mean the source of a FET, the drain of a FET, the collector of a bipolar transistor, the emitter of a bipolar transistor, or any other such terminal in an integrated circuit switching device. The art does not have a term that refers to all these elements, and, as the disclosure indicates, the invention can be implemented with any of them; thus the term source/drain was selected to cover all these possible implementations. In this disclosure the term "channel" means a region in a semiconductor in which the conductivity can be varied by a control element, which is generally termed a "gate". As indicated in the Solution to the Problem section above, a channel region may be a contiguous region, or a noncontiguous region, depending on the implementation of the invention. The implementations described herein are digital implementations in which a "high" voltage represents the digital logic "1" state and a "low" voltage represents the digital logic "0" state. In this disclosure, "high" and "low" when referring to a voltage lever mean the digital logic "1" voltage and the digital logic "0" voltage. In this disclosure, "bit line" means an electrical conductor in a memory which connects one or more memory cells with the memory's data in/out circuitry.

Figure 2:
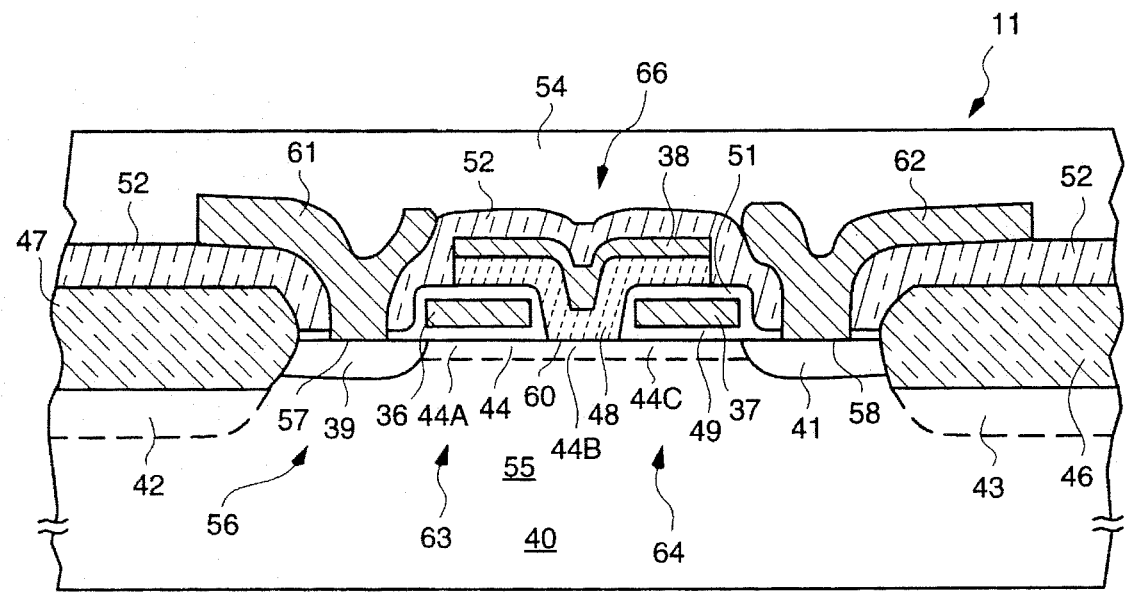
FIG. 2 is a cross-sectional view of a portion of an integrated circuit memory showing a preferred embodiment of the memory cell of FIG. 1.
Figure 3:
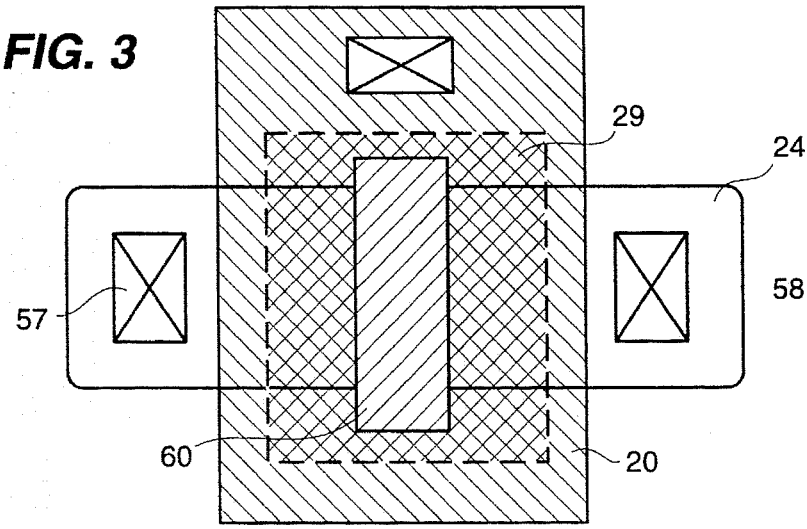
FIG. 3 is an overhead layout of the memory cell of FIG. 2.

FIG. 2 is a cross-sectional view of a portion of an integrated circuit memory which was fabricated according to the invention. As is conventional in the art, the figures showing cross-sectional views of integrated circuit memory cells, such as FIG. 2, are not meant to be actual cross-sectional views of actual electronic devices, but are idealized representations which are employed to more clearly and fully depict the structure and process of the invention than would otherwise be possible. For example, the thickness of the various layers are not representative of the relative thicknesses of the layers, since otherwise some layers would be too thin to show up well in the figures and/or some layers would be so thick that they would not fit on the drawing. The portion of the memory shown in FIG. 2 includes a single memory cell 11. Memory cell 11 was formed on a substrate 40, which was lightly-doped p-type single-crystal silicon, having self-aligned $n^+$ doped source/drain areas 39 and 41, and $p^+$ channel stop doped areas 42 and 43 formed in it. Thus memory cell 11 includes a first doped region 55 having a first dopant type, e.g. a p-type dopant, and a second doped region 56, i.e. the region including source/drains 39 and 41, having a second dopant type, e.g. an n-type dopant. In the discussion below, source/drain 39 will be referred to as the device drain or simply drain, since in the embodiment shown it is a drain, and source/drain 41 will be called the device source or simply source, since in the embodiment shown it is a source. However, just as in the art of conventional FETs, the cells 11 according to the invention are symmetrical and the source/drains are interchangeable; that is, whether a particular source/drain is a source or a drain is determined not by the structure of the memory cell 11 but by the relative voltage applied to the source/drain. The invention could also be implemented on an n-type substrate, or as a bipolar device, with appropriate differences as is known in the art. Other semiconductors, such as gallium arsenide, could also be used. The integrated circuit 10 includes gates 36 and 37, first insulating regions 46 and 47, generally called field oxide regions, gate oxide regions surrounding gates 36 and 37, and second insulating regions 52, all of which were formed as described in U.S. patent application 08/065,666 which is incorporated herein by reference. These insulating regions preferably comprise SOG and BPSG as described in the patent application just cited, but also may be formed of other insulators. Gates 36 and 37 were formed of polysilicon, but could also be formed of metal or other conductive material as known in the art. The ferroelectric material 48 was strontium bismuth tantalate, but could also be other layered superlattice materials as described in U.S. patent application Ser. No. 08/154,927, which is incorporated herein by reference, PZT, or other ferroelectric materials with suitable polarizability and coercive field. Wiring portions 61 and 62 were formed of Pt/Ti/RSi as described in U.S. patent application 08/065,666, but other conductors may also be used. Ferroelectric gate 38 was formed of platinum. In the process of forming the memory 11, contact areas 57, 58, and 60 are formed, which respectively define the interface between the wiring layer portions 61 and 62 and ferroelectric material 48, respectively, and the substrate 40.

A channel region 44 extends between source/drain 39 and source drain 41. Voltages applied to transistor gates 36 and 37 and the polarization state of ferroelectric material 28 effects transistor action in channel region 44 to control the flow of current in the channel 44. As we shall see below, in this particular case, the voltage on the gates or the polarization state effects conductivity in channel region 44 to control the current flow through this channel region. As known in the art, this is but one type of transistor action; the invention also contemplates that other known types of transistor action may be utilized. In the embodiment of FIG. 2, channel region 44 is divided into three subregions: first semiconducting channel region 44A, i.e the channel region generally underneath gate 36; second semiconducting channel region 44B, i.e. the channel region generally under the contact area 60 where ferroelectric material 48 is adjacent substrate 40; and third semiconducting channel region 44C, i.e. the channel region generally under gate 37. Channel region 44 is indicated by a dotted line in FIG. 2 because, as known in the art, such channels do not have a sharply defined boundary, but rather the doping and conductivity that defines the region gradually changes from high doping and conductivity near the surface to much less doping and very little conductivity in the interior of substrate 40. In the embodiment of FIG. 2, the doping of the channel region 44 was adjusted with a boron implant as is known in the art.

Insofar as is known to the inventors, the memory cell 11 is unique in the art, and thus names for each of its parts may only be chosen by analogy to prior art devices. In one sense, cell 11 may be thought of as two pass gate transistors 63 and 64 and a ferroelectric transistor 66, since in one sense each of these parts of the circuit operate independently. However, in another sense, the entire structure can be thought of as a single ferroelectric transistor 11 since the entire device can be considered as a single electronic switch having one channel 44 and a pair of source/drains 39 and 41. In this disclosure we shall refer to the electronic device including drain 39, gate 36, channel region 44A and the oxide between gate 36 and channel region 44A broadly as first transistor means 63, the electronic device including source 41, gate 37, channel region 44C and the oxide between gate 37 and channel region 44C broadly as second transistor means, and the electronic device including gate 38, ferroelectric material 48; and channel region 44B broadly as ferroelectric transistor means 66. Generally "transistor means" means any electronic device having transistor action, including the devices 63, 64, and 66, other known types of transistors, such as MOSFETS, bipolar transistors, etc., or any other type of device having transistor action. With this convention, the circuit diagram of FIG. 1 is a circuit representation both of an embodiment including separate transistors each with a pair of source/drains and is also a representation of the embodiment of FIG. 2. Thus FIG. 1 can be understood in two different senses: one in which it represents an embodiment of the invention in which the transistors 12, 14, and 16 represent separate and distinct conventional integrated circuit transistor structures, and another in which the transistors 12, 14 and 16 represent transistor means in the broad sense, such as transistor means 63, 64, and 66. This is also true for FIGS. 10, 11, 12, 16, 17, 32 and 34. This provides economy in drawings, since otherwise the same figures would be repeated in the drawings.

FIG. 3 is an overhead layout of the memory of FIG. 2. As is known in the art, an overhead layout represents the masks used to form the integrated circuit. Mask 20 defines the gates 36 and 37 which are formed of a single contiguous polysilicon layer, since the voltage applied to them is always the same. Mask 24 defines the doped active areas 39 and 41, though, as will be seen below, this is not a contiguous region since a resist area divides it into two parts during formation, and separate and different voltages may be applied to each active area. Mask 29 defines the ferroelectric transistor gate 38. Contact regions 57, 58 and 60 are defined by masks regions bearing the same numerals.

The electrical properties of interest of ferroelectric transistor means 16 and 66 are qualitatively summarized in FIGS. 4 and 5. FIG. 4 is a graph of the capacitance as a function of the voltage on gate 27 or 38. The capacitance curve of FIG. 4 describes both the capacitance between the ferroelectric transistor gate 27 and the source/drain regions 25 and 26 in the embodiment of FIG. 1, and the capacitance between the ferroelectric transistor gate 38 and the source/drain regions 39 and 41 when the transistor means 63 and 64 are ON. To make the discussion simpler, and thus clearer, the discussion of this graph and other graphs in this disclosure will be in terms of the embodiment of FIGS. 2 and 3, though it should be understood that the discussion is also valid for the embodiment of FIG. 1, in both senses of the figure. The capacitance of FIG. 4 is essentially the capacitance due to the "ferroelectric capacitor", i.e in the region filled by ferroelectric material 48 between gate 38 and the contact region 60, plus the capacitance of the portion 44B of channel 44 directly below the ferroelectric material. Since this capacitance displays hysteresis effects, the graph is a double-valued function. When the voltage on gate 38 is positive, minority carriers (electrons in this case) accumulate to form a channel in channel region 44B, which is called the "accumulation region" of the graph. In the accumulation region, the capacitance is dominated by the ferroelectric capacitor. When the gate voltage is negative, the carriers in the channel are depleted, hence this is called the "depletion region". The capacitance in the depletion region is caused by the capacitance of the "ferroelectric capacitor" and the substrate capacitance in series. Near Vg=0 the capacitance strongly depends on the surface state. In this region, generally for a transistor, one can define a threshold voltage, Vthf, of the ferroelectric device by the equation:

$$Vthf = Vfb + 2\psi f + \psi m \quad (1)$$

where $\psi m$ is a metal work function and $\psi f$ is a surface potential defined by the surface concentration of impurities. Vfb is the flat band voltage given by:

$$Vfb = -Qss/Ci \quad (2)$$

where Qss is the surface charge and Ci is the capacitance of the gate insulator. However, in this case, we must also consider the effect of the remanent polarization of the ferroelectric material 48 and a screening space charge at the interface of the ferroelectric material 48 and the substrate 40. Thus, the ferroelectric threshold voltage becomes:

$$Vthf = 2\psi f + \psi m - Qss/Cf \pm Pr(1-\beta)/Cf \quad (3)$$

where Pr is the ramanent polarization, $\beta$ is the internal screening factor, and Cf is the capacitance of the ferroelectric thin film 48. If we consider the effects of screening by the space charge to be a surface effect, we can rewrite equation 3 as:

$$Vthf = 2\psi f + \psi m - (Qss \pm Pr*\beta)/Cf \pm Pr/Cf \quad (4)$$

The flat band voltage is modulated by the ramanent polarization which is non-zero once the ferroelectric material 48 has been polarized, and results in the hysteresis of FIG. 4 in which the capacitance can take on two different values at Vg =0, a higher value shown at "A" and a lower value shown at "B".

If the device is to be a non-destructive readout device, the voltage applied across the ferroelectric layer 48 during read out should be less than the value of the coercive voltage of the ferroelectric film 48. Since the coercive voltage is not always exactly repeatable in a ferroelectric material when many disturbance pulses have occurred, the voltage applied across the ferroelectric film should be less than one-half the coercive voltage. As will be seen below, the voltage of source 43 is the same as the voltage of gate 38 in the read operation, and thus the difference between the source and drain voltage should also be less than half of the coercive voltage. Thus, considering the transistor means 66 as a MOS transistor operating in the sub-threshold region, and assuming that both transistor means 63 and 64 are ON, that when the transistor means 63 and 64 are ON the resistance of the channel regions 44A and 44C is much less than the resistance of channel region 44B under the ferroelectric material 48 so that the current in the channel 44 is essentially determined by the current in the portion 44B of the channel, then the current, Ids, between the source 41 and drain 39 will be:

$$Ids = (W/L)*I_0*Exp[(q/kT)*(Vg-Vs-Vthf)] \quad (5)$$

where W is the width of the channel portion 44B, L is the length of the channel portion 44B, $I_0$ is the current at zero voltage, q is the unit charge on an electron, k is the Boltzmann constant, a factor depending on back bias effects, and Vs is the voltage difference between the source 43 and the substrate. Thus, the current in turn has a hysteresis effect and takes on two different values at any given voltage, and assuming complete charge compensation, these values are given by:

$$Ids(1) = (W/L)*I_0*Exp[(q/kT)*(Vg-Vs-Vthf0+Pr/Cf)] \quad (6)$$

and $$Ids(0) = (W/L)*I_0*Exp[(q/kT)*(Vg-Vs-Vthf0-Pr/Cf)] \quad (7)$$

where Vthf0 is the threshold voltage at "zero" polarization. Ids(1) and Ids(0) are graphed in FIG. 5. At zero gate voltage, the current, like the capacitance, can take on two hysteresis states, "A" and "B" as indicated in FIG. 5. The polarization of the ferroelectric transistor means 66 in the "A" state is shown in FIG. 6, while the polarization of the ferroelectric transistor means 66 in the "B" state is shown in FIG. 7. As shown in FIG. 5, when the polarization is in the "A" state the current is essentially off, thus this may be considered to be the OFF state, symbolized as shown in FIG. 8; the "B" state similarly may be considered as the ON state. If the OFF state is identified with a logic "0" and the ON state is identified with a logic "1", then the cell 11 becomes a digital logic storage system and the memory becomes a digital memory.

One embodiment of a method of writing to and reading a memory cell 10, 11 according to the invention is shown in FIGS. 10 through 17. In this embodiment the memory is operated as a read-only-memory (ROM). Further, it is assumed that pass gate transistors 12 and 14 are n-channel MOSFETs, Vcc is the "high" system voltage, and Vss is the "low" system voltage. However, it should be understood that p-channel MOSFETS, bipolar transistors or other transistors could also be used with appropriate voltage and other changes as is known in the art. It will also be assumed that the difference between Vcc and Vss is greater than the coercive voltage required to change the polarization of the ferroelectric material 28, 48. The discussion of the application of the operating voltages will be in terms of the circuit of FIG. 1 since the circuit representation lends itself more readily to such a discussion, while the discussion of the effect of the voltages within the ferroelectric transistor means 16, 66 will be in terms of the physical integrated circuit structure of FIGS. 2 and 3, since the physical structure representation lends itself more readily to that discussion; however, it should be evident that both portions of the discussion are equally applicable to either embodiment.

Figure 10:
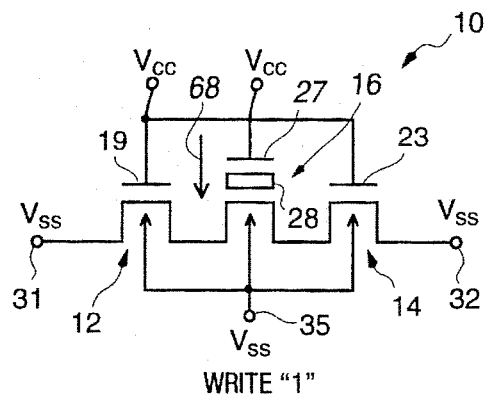
FIG. 10 illustrates the voltages applied to the components of the memory cell of FIG. 1 when programming or writing the cell to the logic "1" state.

As shown in FIG. 10, if Vcc is applied to the gates 19, 23 and 27 of transistors 12, 14 and 16 respectively, and if at the same time the Vss voltage is applied to the terminals 31 and 32 and the substrate terminal 35, then an electric field in the direction of the arrow 68 will be formed across ferroelectric material 28 and it will assume a polarization state as shown in FIG. 7, if it is not already in that polarization state. This writes a logic "1" to the memory cell 10. Thus this operation is used as an "erase" signal to write all memory cells to a logic "1" prior to programming the memory.

Figure 11:
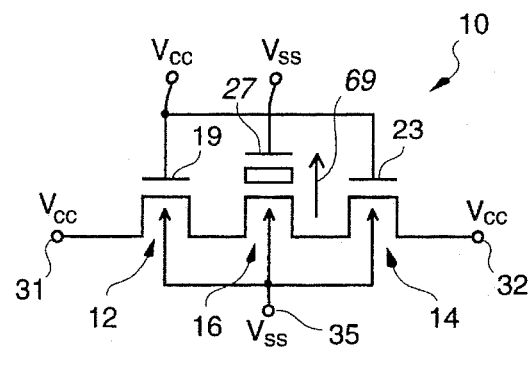
FIG. 11 illustrates the voltages applied to the components of the memory cell of FIG. 1 when programming or writing the cell to the logic "0" state.
Figure 12:
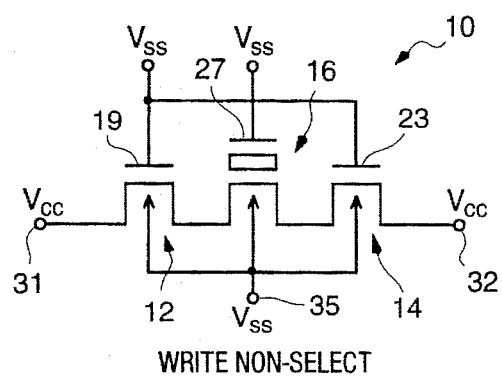
FIG. 12 illustrates the voltages applied to a non-selected memory cell in the program or write mode.

The application of voltages to write a logic "0" to a cell is shown in FIG. 11. The Vcc voltage is applied to gates 19 and 23 and to terminals 31 and 32. The voltages applied to gates 19 and 23 turn on the transistors 12 and 14 so that the signal applied to terminals 31 and 32 is also applied to the channel under ferroelectric transistor 16. If at the same time the Vss voltage is applied to gate 27, creating an electric field in the direction of arrow 69 across ferroelectric material 28 forcing it to assume a polarization state as shown in FIG. 6. If the cell 10 is not selected to be written to, then the gates 19 and 23 will be held at the Vss voltage as shown in FIG. 12. Thus the transistors 12 and 14 are turned off and the Vcc voltage applied to terminals 61 and 62 is not passed to channel region 44B under ferroelectric transistor 16, and, as shown in more detail in the discussion of FIGS. 14 and 15 below, a logic "1" remains written to the cell.

Figure 13:
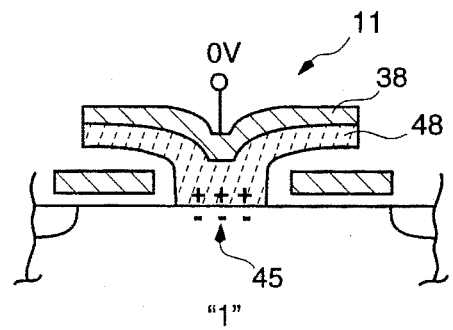
FIG. 13 illustrates the charge distribution at the interface of the ferroelectric material and the semiconductor substrate after a logic "1" has been written to the memory cell.
Figure 14:
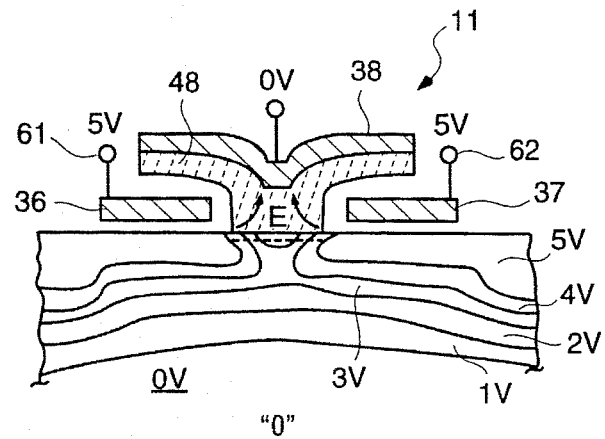
FIG. 14 illustrates the electric field in the ferroelectric material and the electric potential in the semiconductor substrate under the ferroelectric material when a logic "0" has been written to the memory cell.
Figure 15:
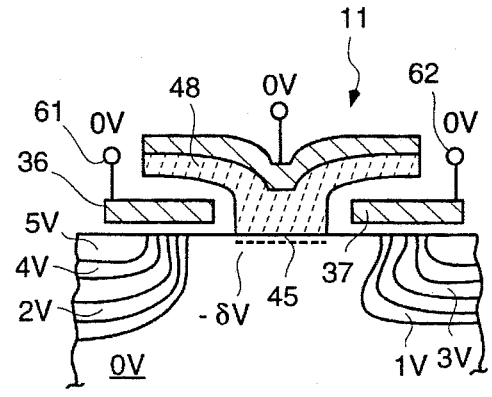
FIG. 15 illustrates the electric state of the unselected memory cell in the program or write mode.

In FIGS. 13–15 it is assumed that Vcc=5 volts and Vss=0 volts, which are the most common values for integrated circuit "high" and "low" voltages. However, the memory according to the invention also works with lesser or greater Vcc voltages, such as 3 volts. FIG. 13 shows the electrical state of the cell 11 after a logic "1" has been written to the cell. The polarization of the ferroelectric material 48 causes a strong positive charge on the ferroelectric side of the ferroelectric/semiconductor interface creates an inversion area in the channel portion 44B below the ferroelectric material, which is shown in FIG. 13 by minus signs indicating electrons as the charge carrier. Such a state is difficult to override and the data will stay written even if a zero voltage is applied to gate 38 in other read/write cycles as shown in FIG. 13.

FIG. 14 shows the electrical state of the cell 11 in the process of writing a logic "0" to the cell. Assuming the cell was previously in a logic "1" state, even though the substrate is at zero voltage, the high potential on gates 36 and 37 will cause high conductance in the channel region 44 beneath the gates 36 and 37, which will allow the 5 volt field to broaden into the region below the ferroelectric material 48. At first the broadening will be limited to only the regions near the rim of the ferroelectric material. This will cause partial domain inversion in the ferroelectric, since gate 48 is at zero potential. This partial domain inversion will cause the area of high potential in channel portion 44B to broaden, and more of the ferroelectric domains will invert. Thus positive feedback occurs, and the cell rapidly flips to the logic "0" state.

If the cell 11 is not selected, then, as shown in FIG. 15, the channel region under the gates 36 and 37 is not conductive, and the voltage applied at terminals 61 and 62, rapidly falls off in the region under the gates, and the channel region 44B under the ferroelectric material 48 remains at essentially zero volts, there is no field to switch the polarization, and the polarization stays in its previous state.

Figure 16:
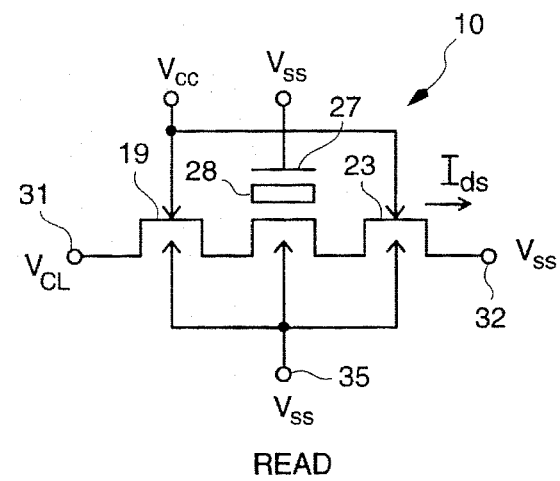
FIG. 16 illustrates the voltages applied to the various components of a selected memory cell in the preferred embodiment of the nondestructive read process according to the invention.
Figure 17:
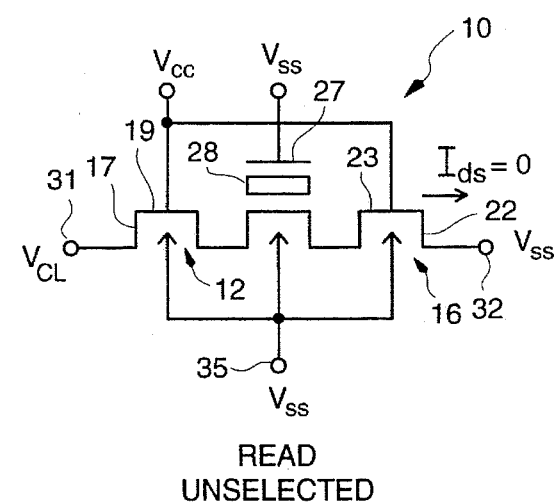
FIG. 17 illustrates the voltages applied to the various components of a nonselected memory cell in the preferred embodiment of the nondestructive read process according to the invention.

The non-destructive read out (NDRO) process is shown in FIGS. 16 and 17. In FIG. 16 the Vcc voltage is applied to gates 19 and 23, while the Vss voltage is applied to gate 27, terminal 32, and substrate terminal 35. A voltage between Vss and Vcc, called a clamping voltage and written Vcl, is applied to terminal 31. Vcl is sufficient to cause a current, Ids, to flow between terminal 31 and terminal 32 when the polarization of ferroelectric material 28 is in the logic "1" state, i.e. the state "B" shown in FIGS. 5 and 7. No current will flow if the ferroelectric material is in the logic "0" state, i.e. the state "A" shown in FIGS. 5 and 6. Since both the gate 27, the substrate, and the terminal 62 are at Vss, there will be little field across ferroelectric material 28 if Vcl is low enough. Thus the ferroelectric material 28 will remain in whatever state it is in. If gates 19 and 23 are held at Vss, then, as shown in FIG. 17, transistors 12 and 16 will not turn on and there will be no current between drain 17 and source 22. There will also be no field across ferroelectric 28 (except the polarization field), since both gate 27 and substrate terminal 35 are at zero voltage and the voltages on terminals 31 and 32 have no effect since transistors 12 and 14 are off.

When memory cell 11 is read, there is a slight disturbance of the polarization of ferroelectric material 48 caused by the voltage Vcl. In many ferroelectrics, this disturbance will decrease the switching charge Qsw. Preferably, Vcl is selected to be in the range from 20% of the coercive voltage of ferroelectric material 28, 48 to 50% of the coercive voltage of the ferroelectric material. This ensures that the disturbance caused by the voltage will not change the polarization state of the ferroelectric material.

Figure 18:
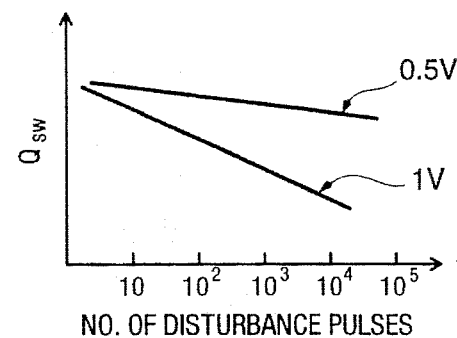
FIG. 18 shows a graph of switching charge versus number of disturbance pulses of a memory cell according to the invention for a memory cell having a switching threshold of about 1.5 volts.

The decline of switching charge Qsw, versus numbers of switching pulses was measured for a memory cell 11 using PZT having a switching threshold of 1.5 volts as the ferroelectric material 48 and for clamping voltages of 1 volts and 0.5 volts. The results are shown in FIG. 18. The results show that if the clamping voltage is kept at below 0.5 volts very little decrease in the switching charge occurs. In general Vcl is kept at as low a voltage as possible that will still reliably produce a detectable current, Ids, when data is read. Roughly, it can be seen that:

$$Ids(1)=Vcl/Rfon \qquad (8)$$

$$Ids(0)=Vcl/Rfoff \qquad (9)$$

where Rfon and Rfoff are the resistances of channel portion 44B when ferroelectric material 48 is in the ON polarization state and OFF polarization states respectively. Those skilled in the art will recognize that the polarization charge of well-known ferroelectrics is sufficient to make a considerable difference in Rfon an Rfoff, therefore, it is seen that the difference between Ids(1) and Ids(0) is readily distinguishable with voltages Vcl below 0.5 volts. Recently, ferroelectric materials that demonstrate much less decrease in switching charge than PZT have been discovered. See U.S. patent application Ser. No. 08/154,927. These materials are the preferred materials for layer 28, and make the memory according to the invention highly practical.

Figure 19:
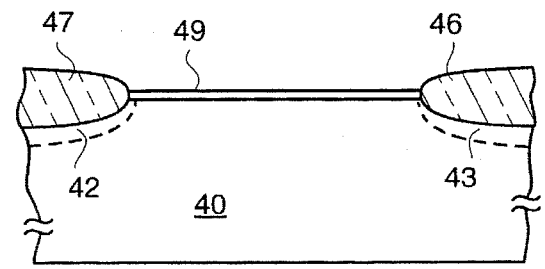
FIG. 19 is a cross-sectional view of an integrated circuit memory cell of FIG. 2 after the LOGOS isolation and gate oxidation step.

FIGS. 19 through 25 together with FIG. 2 illustrate the preferred embodiment of fabricating a memory cell 11 according to the invention. The memory cell 11 is a part of an integrated circuit memory (FIG. 34) that is formed on a substrate 40 which is preferably a single crystal, lightly p-doped silicon wafer, though it may be n-type silicon, polysilicon, gallium arsenide or other substrates, with suitable changes in the other structures as known in the art. The memory cell 11 is preferably formed with a self-aligned technology. Turning to FIG. 19, in the preferred embodiment the substrate 40 forms a semiconductor well in which the semiconductor portions of memory 11 will be constructed, though in other embodiments, a semiconductor well may be formed with a deep diffusion process, such as ion implantation. Channel stopper regions 42 and 43 are formed, preferably by ion implantation as is known in the art, and a LOCOS process is used to form field oxide regions 42 and 43. Then a first gate insulating layer 49, i.e. a gate oxide 49, is formed in a conventional manner. At this point the threshold voltage of the transistor channel region 44 is adjusted by a low power implant, as known in the art.

Figure 20:
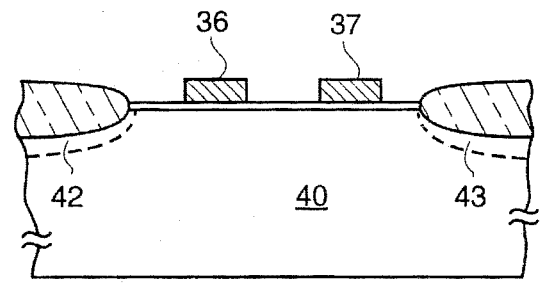
FIG. 20 is a cross-sectional view of the integrated circuit memory cell of FIG. 2 after the formation of the polysilicon gate.
Figure 21:
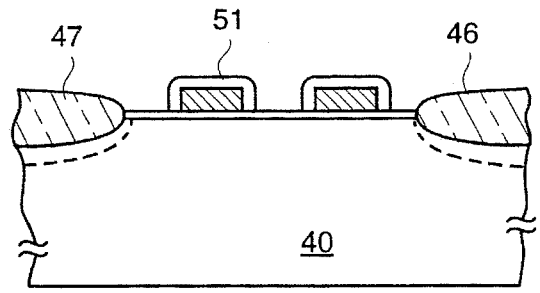
FIG. 21 is a cross-sectional view of the integrated circuit memory cell of FIG. 2 after the formation of the gate oxide.

Turning to FIG. 20, a conductive layer is formed on the wafer, preferably of heavily-doped polysilicon, though, as known in the art, other gate material may be used. The gates 36 and 37 are then patterned out of the conductive layer by reactive ion etching (RIE) or other etch process. The polysilicon is then oxidized as shown in FIG. 21 to form second gate insulating layer 51 which isolates the gates 36 and 37.

Figure 22:
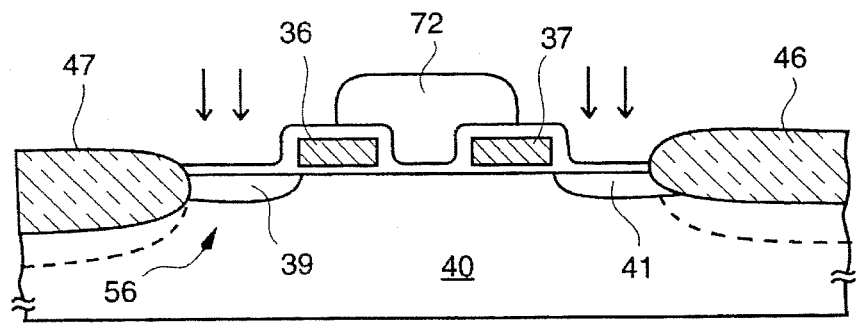
FIG. 22 is a cross-sectional view of the integrated circuit memory cell of FIG. 2 showing the formation of the source/drain doped regions.
Figure 23:
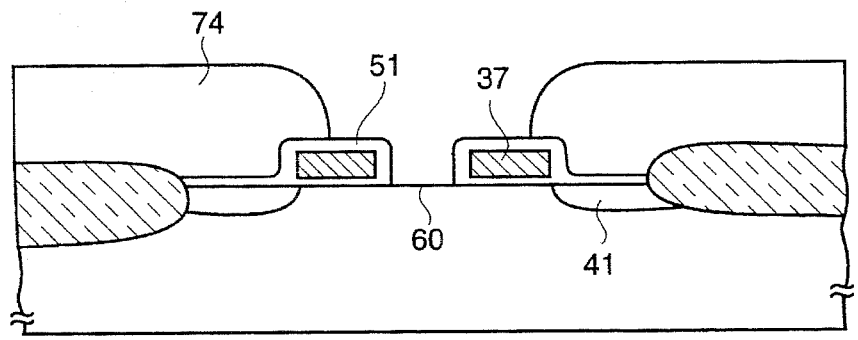
FIG. 23 is a cross-sectional view of the integrated circuit memory cell of FIG. 2 after the removal of the oxide in the ferroelectric contact hole.
Figure 24:
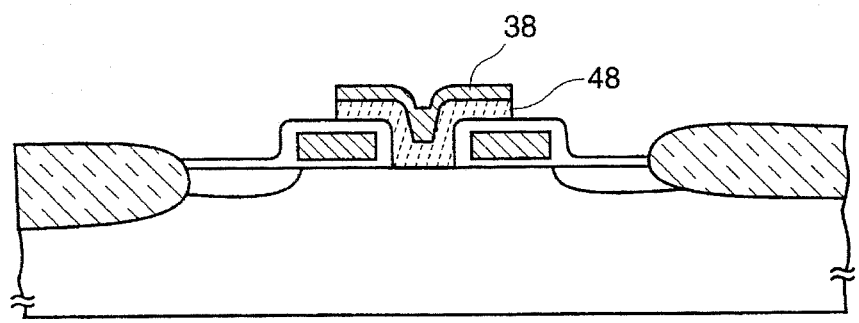
FIG. 24 is a cross-sectional view of the integrated circuit memory cell of FIG. 2 after the formation of the ferroelectric material and ferroelectric gate.
Figure 25:
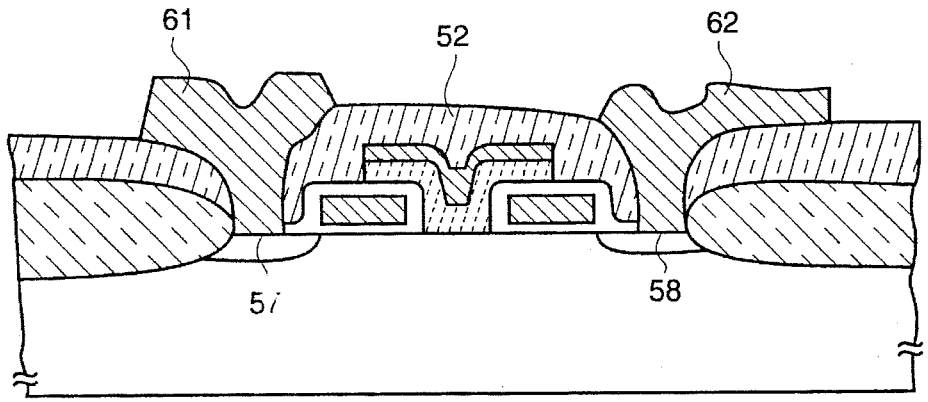
FIG. 25 is a cross-sectional view of the integrated circuit memory cell of FIG. 2 after the formation of the wiring layers.

Turning to FIG. 22, source/drains 39 and 41 are formed by a self-aligned process: a resist layer 72 is deposited then patterned in a photo-mask process followed by the formation of source/drains 39 and 41 by ion implantation in the exposed areas between the; gates 36 and 37 and the field oxide areas 46 and 47. This forms self-aligned second doped region 56, preferably of n-type dopant, within first doped region 55. That is, doped source/drains 39 and 41 are automatically aligned with gates 36 and 37. As mentioned above, resist 72 and the gates 36 and 37 which shield the area below them from most of the implantation, separate the source/drains 39 and 41 so second doped region 56 is formed into several noncontiguous portions 39 and 41. Resist 72 is removed and another resist layer 74 is deposited and patterned in a photo-mask process followed by a controlled etch which is long enough to remove the thin oxide 49 over the contact region 60 but not long enough to remove the oxide layer 51, as shown in FIG. 23. Then ferroelectric layer 48 and ferroelectric transistor gate 38 are deposited, preferably also by a self-aligned process. The ferroelectric layer 48 is preferably strontium bismuth tantalate, though it may be another layered perovskite as described U.S. patent application Ser. No. 08/154,927, PZT or other known ferroelectric material. The deposition is preferably by spin coating or misted deposition as also described in the above patent application, though other deposition processes, such as chemical vapor deposition, may be used. The gate 38 is preferably formed of platinum, though Pt/TiN, and other electrodes known in the art to be suitable for use with ferroelectric materials may be used. The gate 38 and ferroelectric film 48 are then annealed and patterned by ion milling, RIE, or other known process, preferably as described in U.S. Pat. No. 08/065,666. An insulating layer 52, preferably spin-on-glass, though other insulators such as BPSG may be used, is then deposited, followed by the formation of the metalization wells and the removal of the oxide over contact areas 57 and 58 in another resist-photomask process. A metalization layer is then deposited, preferably a multilayer of Pt/Ti/PtSi, but other materials such as AlSi, AlTi, AlTa, platinum or other metals or polysilicon may be used. The metalization layer is then patterned in a conventional manner to form wiring terminals 61 and 62, and a passivation layer 54 (FIG. 2), preferably SOG or BPSG is deposited to complete the device.

Figure 26:
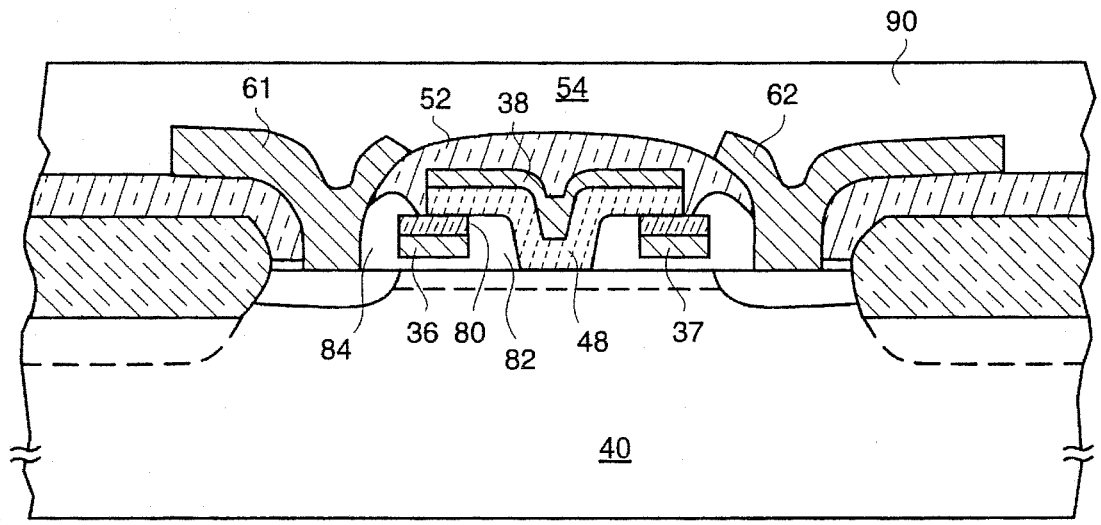
FIG. 26 is a cross-sectional view of a portion of an alternative preferred embodiment of an integrated circuit memory according to the invention showing an alternative preferred memory cell having an insulative isolation layer formed between the polysilicon gates and the ferroelectric material.
Figure 27:
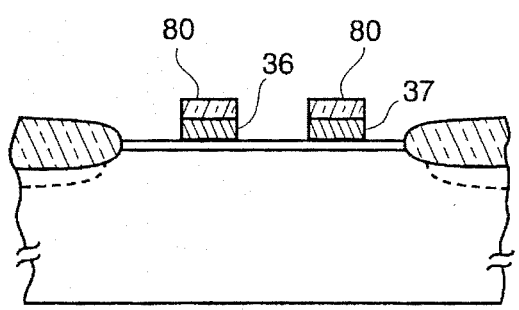
FIG. 27 is a cross-sectional view of the integrate circuit memory cell of FIG. 26 after the formation of the isolation layer over the polysilicon gate.

An alternative embodiment of an integrated circuit memory cell 90 is shown in FIG. 26. The same numbers as used for the embodiment of FIG. 2 are used to indicate equivalent parts of this embodiment, since it differs only a little from the embodiment of FIG. 2. This embodiment differs from the embodiment of FIG. 2 in that an isolation layer 80 is formed over each of gates 36 and 37 and insulating spacers 82 and 84 are formed on either side of gates 36 and 37. The isolation layer 80 and spacers 82 further isolate the ferroelectric material 48 from the polysilicon of the gates 36 and 37.

Figure 28:
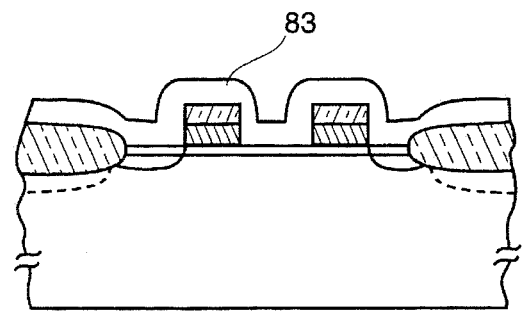
FIG. 28 is a cross-sectional view of the integrate circuit memory cell of FIG. 26 after the formation of an additional interdielectric layer.
Figure 29:
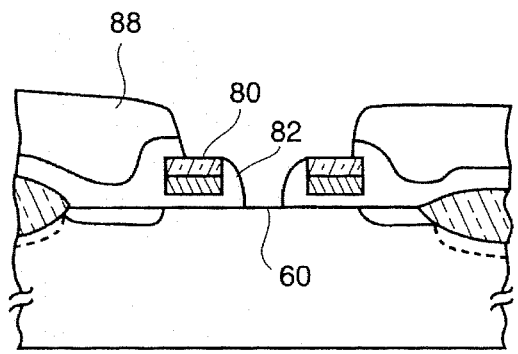
FIG. 29 is a cross-sectional view of the integrate circuit memory cell of FIG. 26 after the removal of the oxide in the ferroelectric contact hole.
Figure 30:
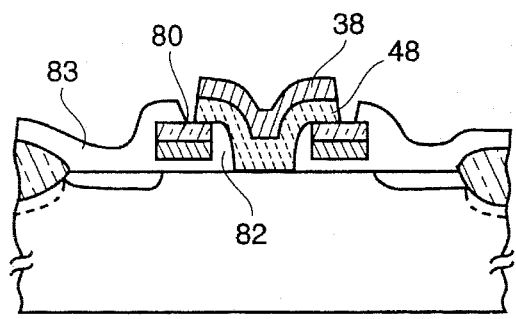
FIG. 30 is a cross-sectional view of the integrated circuit memory cell of FIG. 26 after the formation of the ferroelectric material and ferroelectric gate.

The process of fabricating the alternative embodiment of the memory cell 90 is illustrated in FIGS. 27–30 together with FIG. 26. The alternative process proceeds to the formation of the gate polysilicon layer as described above, then is followed by the deposition of a gate isolation layer, preferably made of $Si_3N_4$, though it may also be made of silicon oxide or other insulator, in a conventional process. The gate polysilicon and isolation layer are then patterned as the polysilicon was before to form gates 36 and 37 covered by isolation layers 80. The polysilicon gates 36 and 37 are between 250 nanometers (nm) and 600 nm in thickness while the isolation layer 80 is between 100 nm and 350 nm in thickness. Then a thicker layer 83 of $Si_3N_4$ or silicon dioxide is deposited as shown in FIG. 28 followed by a layer of resist 88. Then, a controlled etch is performed to etch down to contact 60, leaving isolation layers 80 and spacers 82. Ferroelectric layer 48 and ferroelectric transistor gate 38 are then formed as before (FIG. 30) and followed by the wiring terminals 61 and 62 and passivation layer 54 (FIG. 26) as described in the discussion of the fabrication of the embodiment of FIG. 2.

Figure 31:
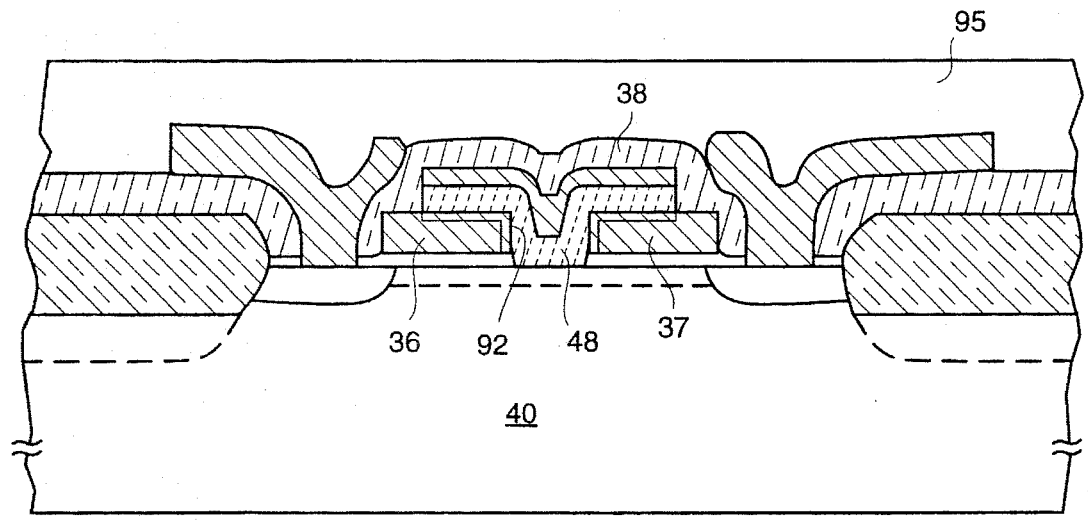
FIG. 31 a cross-sectional view of a portion of another alternative preferred embodiment of an integrated circuit memory according to the invention showing an alternative preferred memory cell having the ferroelectric material deposited directly on the polysilicon gates.

A further embodiment of an integrated circuit memory cell 95 according to the invention is shown in FIG. 31. This embodiment is the same as the embodiment of FIG. 2, except that the insulation layer 51 (FIG. 2) is not formed in a separate step. Instead, ferroelectric layer 48 is deposited directly on the polysilicon gates 36 and 37. It has been found that the polysilicon oxidizes during heat treatment of the ferroelectric layer 48, thus an isolation layer 92 automatically forms. Further it has been found that even if heat treatment and oxidation of the polysilicon is minimized so that the ferroelectric material 48 directly contacts the polysilicon, the memory still operates as before since the ferroelectric material 48 is an insulator, and the effect of the gates 36 and 37 on the polarization of the ferroelectric material does not alter the operation of the device.

Figure 32:
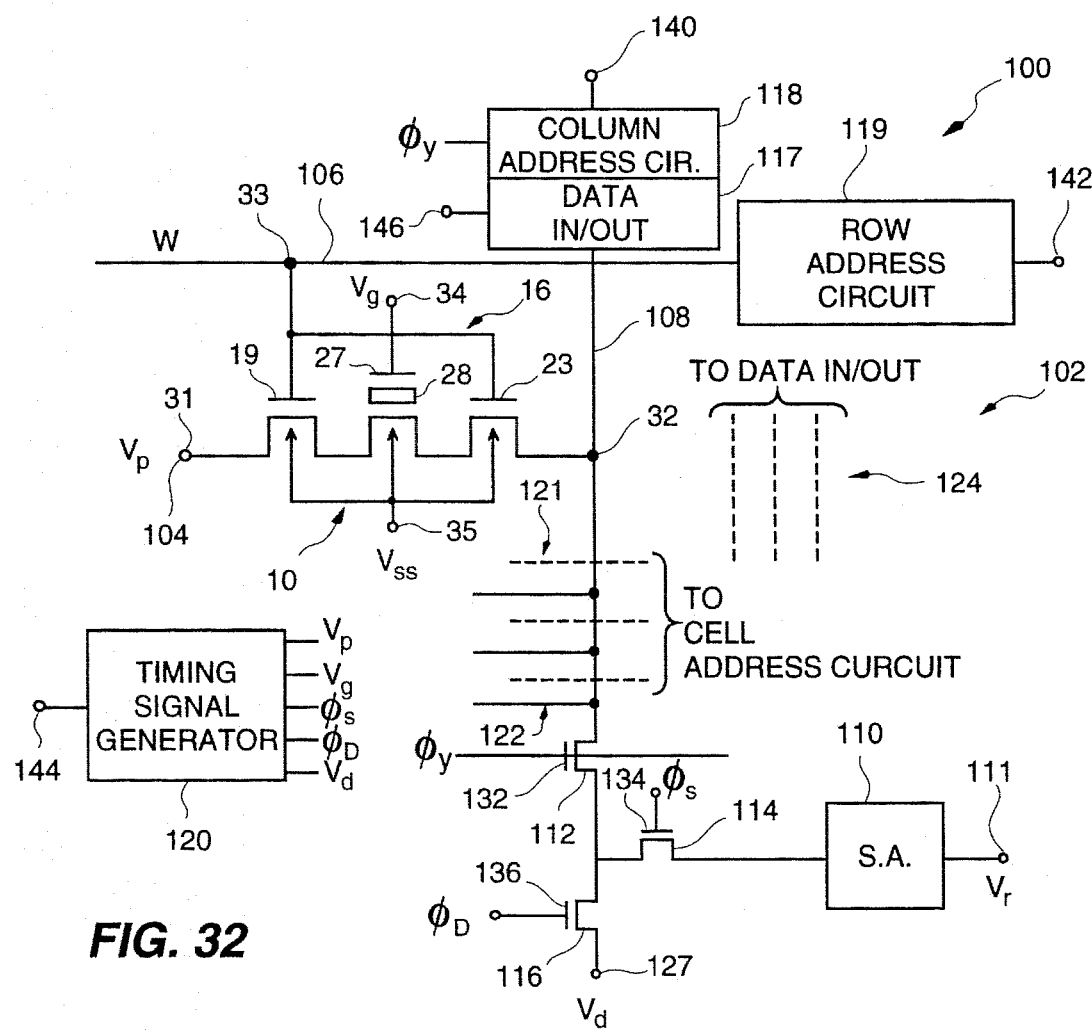
FIG. 32 is a circuit diagram of an exemplary embodiment of a memory according to the invention.

A circuit diagram of an integrated circuit memory 100 according to the invention is shown in FIG. 32. Memory 100 is shown as including an array 102 of memory cells 10 as described with reference to FIG. 1, since the drawing of FIG. 1 lends itself more readily to a circuit diagram. However, FIGS. 32 and 33 should be understood in the sense mentioned above in which the circuit of FIG. 1 is also a circuit representation of the embodiment of FIG. 2, since the preferred memory is one utilizing the embodiment of FIG. 2 as the memory cell. In addition to memory cell 10, memory 100 includes word line 106, digit line 108, also referred to in the art as bit line 108, sense amplifier 110, a source 111 of a reference voltage, Vr, transistors 112, 114, and 116, data in/out circuitry 117, column address circuitry 118, row address circuitry 119, and timing signal generator 120. As is known in the memory art, array 102 includes a plurality of rows and columns of memory cells identical to cell 10. Each row is addressed by and connected to row address circuitry 119 by a word line, as represented by dotted lines 121. Each column of cells is connected to Data In/Out circuitry 117 via a separate bit line, as represented by dotted lines 124. Each of the cells in the same column as cell 10 is connected to the data in/out circuitry via bit line 108, as indicated by the solid lines 122. Row Address Circuity 118, Column Address Circuitry 119, and Timing signal Generator 120 circuit each include a terminal 140, 142 and 144, respectively, each of which, as known in the art, represents a plurality of inputs. As known in the art, certain signals applied to memory 100 via terminals 140, 142 and 144 cause memory 100 to store information determined by signals input to Data IN/Out circuit 117 via terminal 146, which terminal also comprises a plurality of inputs and outputs. Other signals applied to memory 100 via terminals 140, 142 and 144 cause it to output, via Data IN/Out circuit 117 and terminal 146, signals representing information stored in its memory cells 10.

In the embodiment of memory 100 shown in FIG. 32, terminal 31 of cell 10 is connected to the source 104 of a plate voltage, which preferably is a voltage of 0.5 volts or smaller as discussed above. Terminal 32 is connected to bit line 108, and terminal 33 is connected to word line 106. A gate voltage Vg, which takes on the values discussed above and is generated by timing signal generator 120, is applied to terminal 34, and, also as discussed above, terminal 35 is connected to the Vss voltage. Word line 106 is connected to Row Address Circuit 119 which applies voltages as discussed above to the gates 19 and 23. Bit line 108 is connected to Data In/Out circuitry 117, and also to terminal 127 through transistors 112 and 116. Sense amplifier 110 is connected to bit line 108 through transistor 114. The gates 132, 134, and 136 of transistors 112, 114 and 116 are connected to the $\psi_y$, $\psi_s$, and $\psi_D$ signals respectively, the first of which is output by Column Address Circuitry 118 and the latter two of which are produced by Timing Signal Generator 120. The signals Vp and Vd input to terminals 104 and 127 respectively, are produced by timing signal generator 120.

As known in the art, Column Address Circuitry 118 includes a Y-multiplexer and Row Address Circuitry 119 includes an X-multiplexor. Transistor 112 represents a portion of the Y-multiplexer of Column Address Circuitry 118. In response to cell address signals input via terminals 140 and 142, Column Address Circuitry connects Data In/Out circuit 117 to the bit line of the selected cell and turns on the appropriate transistor 112 to connect the sense amplifier and other circuitry below the transistor 112 to the selected bit line. Likewise Row Address Circuit 112 activates the selected cell by driving the signal w on the word line of the selected cell high. Transistor 116 is a pre-charge transistor to connect the bit line of the selected cell to ground to ensure all charge is removed from it prior to the start of a cycle. Transistor 114 connects the sense amplifier to the bit line at an appropriate time to read it. As known in the art, sense amplifier 110 compares the signal on the bit line to the reference voltage 111. If the voltage on the bit line is higher than the reference voltage Vr, then the sense amplifier drives the bit line to a high or logic "1" voltage level, and if the voltage on the bit line is lower than the reference voltage Vr, then the sense amplifier drives the bit line to a low or logic "0" voltage level. Reference voltage, Vr, is less than Vcl and is preferably about ½ Vcl.

Figure 33:
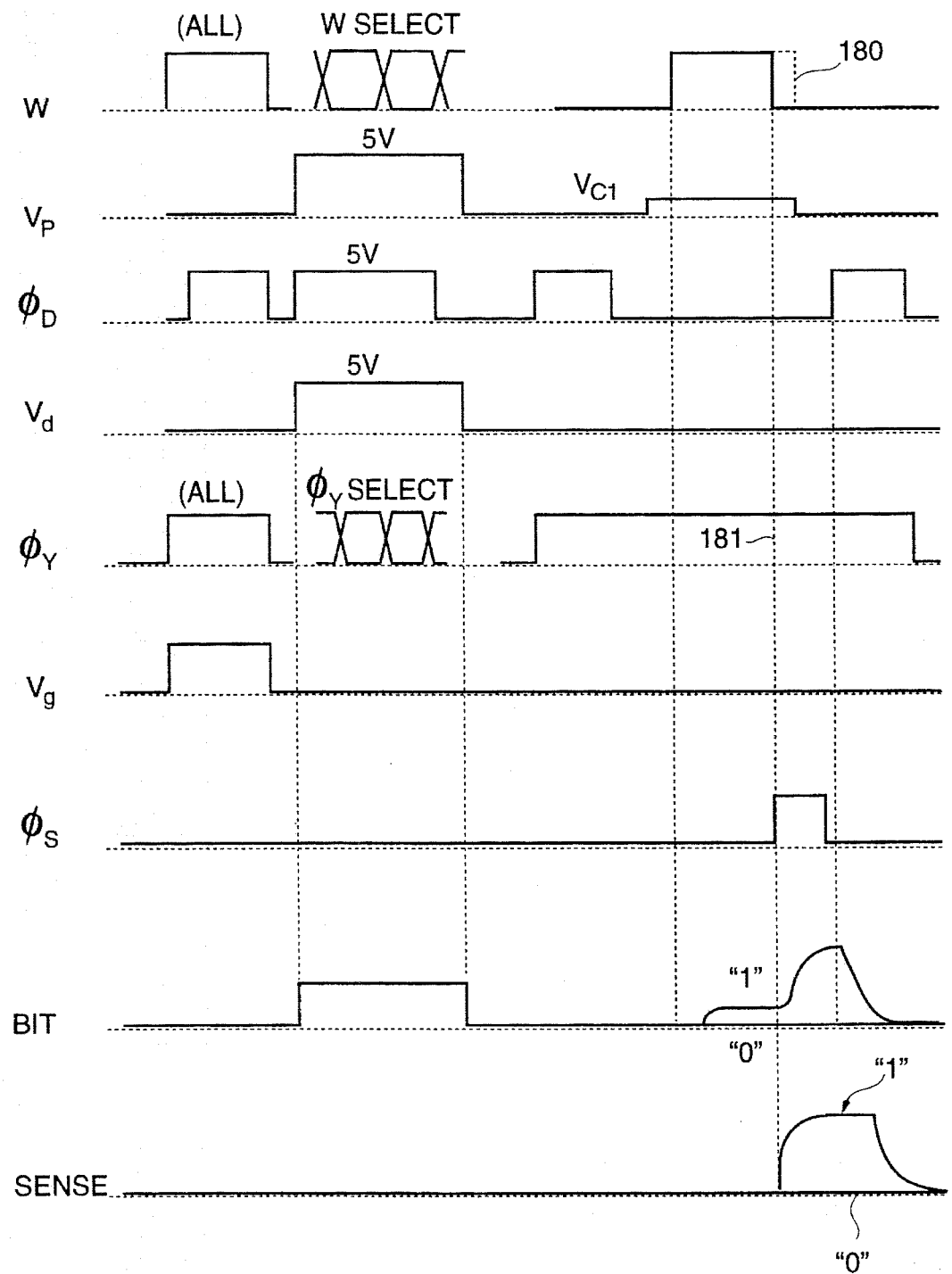
FIG. 33 is a timing chart according to the invention showing the various signals of the circuit of FIG. 32 and the bit line voltage.

FIG. 33 shows a timing chart of the signals applied to and output by the memory 100 during a typical cycle, thus illustrating the operation of the memory 100. The signals of the timing chart were all discussed above. In the discussion below we assume that in the initial programming write "1" function, all cells are selected, and otherwise the cell 10 shown in FIG. 32 is the selected cell. To start a programming cycle, all word lines, $\psi_D$, $\psi_y$, and Vg go high, and Vp and $\psi_s$ stay low. Since the signals $\psi_D$ and $\psi_y$ are high and Vd is low, transistors 112 and 116 are on, and bit line 108 and terminal 32 are forced to Vss. Thus the signals shown in FIG. 10 are placed on the gates 19, 23, and 27, the terminals 31 and 32 of the cell 10 and every other cell in the memory, thus writing a logic "1" to all cells. Then the signals, w, $\psi_D$, $\psi_Y$, and Vg go low in preparation for the next cycle.

Next, the signals Vp, Vd and $\psi_D$ go high and immediately the signal w on the selected word line 106 and the signal $\psi_y$ on the transistor 112 for the selected bit line 108 go high to address cell 10. Vg stays low. This places the signals shown in FIG. 11 on the gates 19, 27, and 23, and terminals 31 and 32 of cell 10, thereby writing a logic "0" to the selected cell 10. Then the signal w on the word line 106 and the signal $\psi_y$ of the transistor 112 connected to bit line 108 drop to zero deselecting cell 10, and the signals w and $\psi_y$ for the next cell selected go high, writing a logic "0" to the next selected cell until all cells that are to be programmed to a logic "0" have been selected. Then after all cells have been programmed and the signals w and $\psi_y$ for the last programmed cell have gone back low, $\psi_D$ goes low to disconnect the Vd signal from the circuit, and then Vp and Vd go low in preparation for the next cycle.

The next part of the timing chart of FIG. 33 illustrates a read cycle. First $\psi_y$ for the selected bit line goes high and at the same time $\psi_D$ goes high while Vd stays low, which discharges any stray charge that may be on bit line 108. Then Vp goes to Vcl, and shortly thereafter the w signal on word line 106 goes high for the selected cell. Thus the voltages shown in FIG. 16 are now applied to gates 19, 23, and 27 and terminals 31 and 32 of cell 10. This causes a current, Ids, to flow.

If ferroelectric layer 28 is in the logic "0" polarization state, then, as discussed above, the current is essentially zero. Thus, bit line 108 stay at essentially zero volts also. At this point, the signal w on word line 106 goes low, disconnecting the ferroelectric device 16 from the bit line, and $\psi_s$ goes high, turning on transistor 114 and connecting sense amplifier 110 to bit line 108. Since the bit line is lower than reference voltage Vr, sense amplifier 110 drives bit line 108 to zero volts, if it was not already there. Data In/Out circuit reads this a logic "0" and outputs a logic "0" signal on terminal 146.

If ferroelectric layer 28 is in the logic "1" polarization state when the signal w goes high, then the current Ids is approximately equal to Vcl/Rfon, and bit line 108 rises to approximately Vcl. Then, the signal w on word line 106 goes low and $\psi_s$ goes high. The signal w going low prevents the signal on bit line 108 from disturbing the polarization state of ferroelectric material 28 when the bit line goes high. When $\psi_s$ goes high, the sense amplifier sees on bit line 108 a voltage higher than the reference voltage Vr, and drives bit line 108 to a logic "1" voltage. Data In/Out circuit reads this a logic "1" and outputs a logic "1" signal on terminal 146.

Then $\psi_s$ goes back low, isolating the bit line from sense amplifier 110. Then $\psi_D$ goes high, turning on transistor 116 and thus discharging the bit line back to zero volts, since Vd is still at zero volts. Then, $\psi_y$ goes low, disconnecting the bit line from the circuitry below transistor 112, and then $\psi_D$ low again. As known in the art, sense amp 110 resets itself in response to signals from timing generator 120. All voltages are back to their pre-cycle settings. The memory is now ready to read then next memory cell selected.

Figure 34:
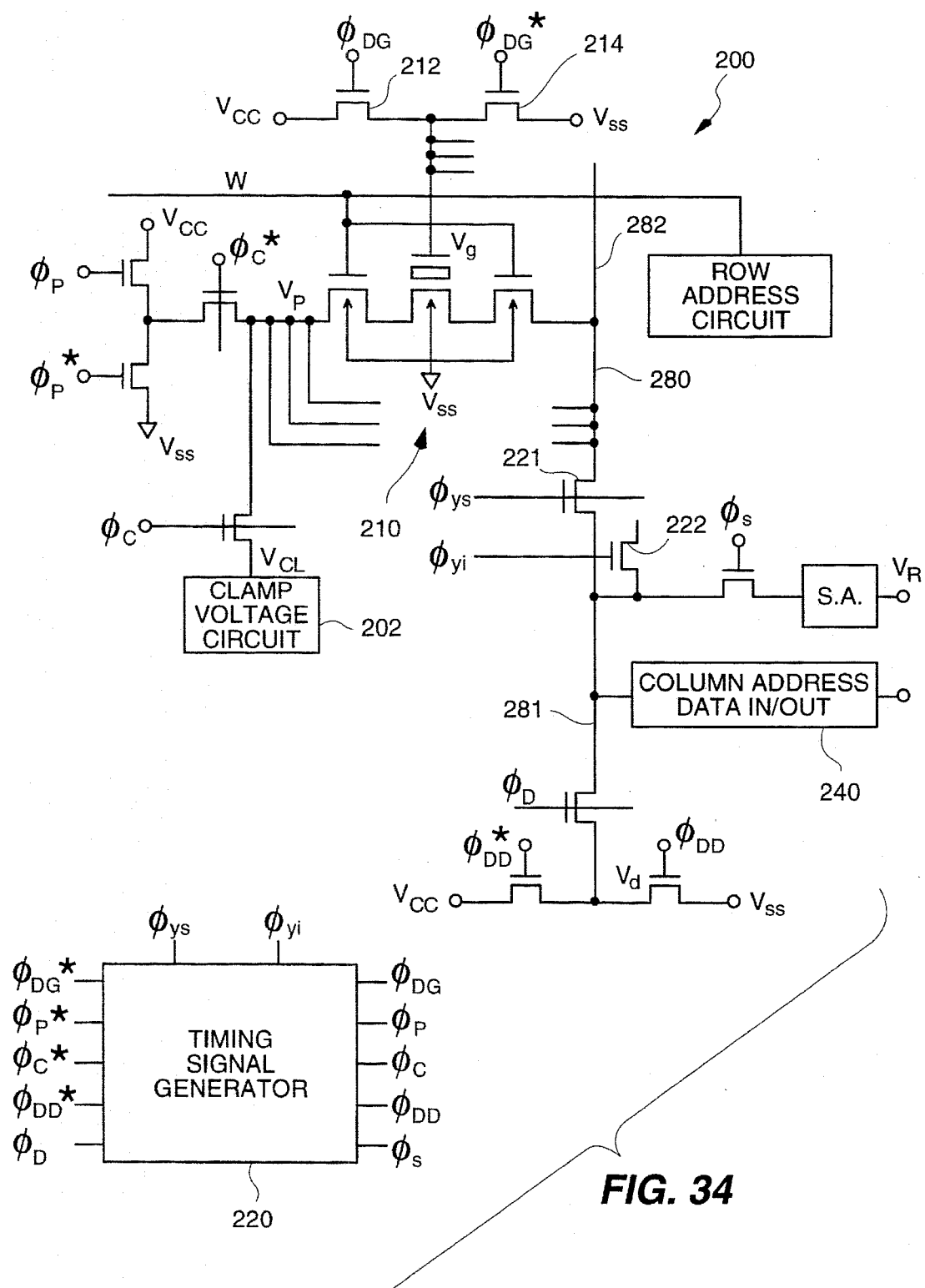
FIG. 34 is a circuit diagram of the preferred embodiment of a memory according to the invention.

In the discussion of the above embodiment, the signals Vg, Vp, and Vd are simply stated as being generated by timing signal generator 120. Many methods and circuits are known in the integrated circuit art for generating signals of a specific voltage at a specific time. FIG. 34 shows an embodiment of a memory 200 in which the signals Vg, Vp and Vd are generated from sources of Vcc and Vs and a circuit 202 designed to generate the voltage Vcl from the Vcc and Vss voltages. Memory 200 operates exactly as memory 100, except that Timing Signal Generator 220 generates the signals $\psi_{DG}$, $\psi_P$, $\psi_C$, $\psi_{DD}$, and their inverses which are indicated by a "*" next to the signal. One can use the timing chart of FIG. 33 to create a timing chart of the foregoing signals. For example, whenever Vp is equal to Vcc, then must be high and $\psi_c$ must be low; whenever, Vp is equal to Vss, then $\psi_p$ must be low and $\psi_c$ must be low; and whenever Vp is equal to Vcl then $\psi_c$ must be high. Likewise one can readily see that whenever Vg is equal to Vcc, $\psi_{DG}$ must be high, and whenever Vg is equal to Vss, $\psi_{DG}$ must be low. Likewise for Vd and $\psi_{DD}$. Similarly, the signals Vp, Vg, and Vd can be generated by replacing one transistor in each pair with a p-channel transistor and using the same signal as the other transistor. For example, if the transistor 214 was replaced with a p-type transistor and the signal $\psi_{DG}$ were applied to it as well as transistor 212, the same signals as discussed above would be created.

Other variations shown in FIG. 34 include separate transistors, such as 221 and 222, connecting each bit line to the sense amp, so that the sense amp going high does not affect any bit line except the one being addressed. In addition, the column address/data in/out circuitry being connected to the portion 281 of line 280 on the opposite side of transistors 221 and 222 from the portion 282 of the line 280 which is connected to the memory cell 210. In this embodiment, we shall refer to portion 281 as the "bit line" since it is connected to the column address/data in/out circuit. With this arrangement, the signals as shown in FIG. 33 would be slightly different, with the signal $\psi_y$ dropping low before the signal $\psi_s$ goes high, as shown at 181 in FIG. 33, thus cutting off the portion 282 of line 280 connected to cell 210, and thus cell 210, from the effects of the sense amp driving the bit line 281 high. Moreover, word line signal w may stay high a little longer and drop low as shown in ghost at 180 in FIG. 33, since there is no need to isolate it from line 280, since the portion 282 it is connected to is not driven high.

Many other variations are possible. Thus, it is evident that those skilled in the art can provide many different versions of circuits than those shown, now that a memory according to the invention and a method of operating it has been described.

There has been described a non-volatile memory that is programmable with low voltages, can be read without destroying the information in its memory cells, and has many other advantages. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiments described, without departing from the inventive concepts. For example, now that it has been disclosed how to create a non-volatile memory from two pass gate transistors and a ferroelectric transistor, many other integrated circuit structures that utilize two areas of conventional transistor action and an area of transistor action determined by a ferroelectric polarization, can now be designed. It is also evident that the memory cells according to the invention may be used with other memory architectures. Equivalent structures, materials and process may be substituted for the various structures, materials and processes described.

We claim:

1. A memory cell for a non-volatile integrated circuit memory, said memory cell comprising:

first transistor means, including a first semiconducting channel region, for effecting transistor action in said first semiconducting channel region to control current flow through said first semiconducting channel region;

ferroelectric transistor means, including a second semiconducting channel region, for effecting transistor action in said second semiconducting channel region to control current flow through said second semiconducting channel region, said ferroelectric transistor means further including a ferroelectric material having a first polarization state and a second polarization state and a ferroelectric gate means for controlling said polarization state of said ferroelectric material; and second transistor means, including a third semiconducting channel region, for effecting transistor action in said third semiconducting channel region to control current flow through said third semiconducting channel region;

wherein said first, second, and third semiconducting channel regions are connected in series.

2. A memory cell as in claim 1 wherein said first, second and third channel regions are contiguous portions of a single semiconducting channel region.

3. A memory cell as in claim 2 wherein said memory cell is formed on and in a semiconductor substrate having a first doped region doped with a first type of dopant and a second doped region doped with a second type of dopant, and said first, second, and third semiconducting channel regions are contiguous portions of said first doped region.

4. A memory cell as in claim 3 wherein said second doped region comprises first and second noncontiguous portions, said first portion located adjacent said first semiconducting channel region and said second portion adjacent said third semiconducting channel region.

5. A memory cell as in claim 1 wherein said first transistor means further comprises a first transistor gate and said second transistor means further comprises a second transistor gate.

6. A memory as in claim 5 wherein said ferroelectric material overlies at least a portion of said first transistor gate and said second transistor gate.

7. A memory as in claim 6 and further including an isolation layer between said ferroelectric material and said first transistor gate and between said ferroelectric material and said second transistor gate.

8. A memory as in claim 7 wherein said isolation layer comprises a material selected from the group comprising silicon dioxide and $Si_3N_4$.

9. A memory as in claim 5 wherein said ferroelectric material directly contacts said first transistor gate and said second transistor gate.

10. A memory cell as in claim 5 wherein said first, second and third channel regions are contiguous portions of a single semiconducting channel.

11. A memory cell as in claim 10 wherein said memory cell is formed on and in a semiconductor substrate having a first doped region doped with a first type of dopant and a second doped region doped with a second type of dopant, and said first, second, and third semiconducting channel regions are contiguous portions of said first doped region.

12. A memory cell as in claim 1 wherein said first transistor means comprises a first transistor, said ferroelectric means comprises a ferroelectric transistor, and second transistor means comprises a second transistor.

13. A memory cell as in claim 12 wherein said first transistor comprises a first MOS transistor, said second transistor comprises a second MOS transistor, and said ferroelectric transistor comprises a ferroelectric FET.

14. A memory cell as in claim 13 wherein:

said first MOS transistor includes a first source/drain and a second source/drain;

said second MOS transistor includes a first source/drain and a second source drain; and said ferroelectric FET includes a first source/drain and a second source/drain; and wherein said second source/drain of said first MOS transistor is connected to the first source/drain of said ferroelectric FET, and said first source/drain of said MOS second transistor is connected to the second source/drain of said ferroelectric FET.

15. A ferroelectric memory device comprising: a substrate, a channel region in said substrate, a first conducting gate overlying at least a first portion of said channel region, a second conducting gate overlying at least a second portion of said channel region, a ferroelectric material overlying at least a third portion of said channel region between said first and second conducting gates, and a ferroelectric gate overlying at least a portion of said ferroelectric material.

16. A non-volatile integrated circuit memory comprising a plurality of bit lines, a plurality of word lines, a plurality of memory cells, a source of a plate voltage, row address means for applying signals to selected ones of said memory cells via said word lines, column address means for applying signals to selected ones of said memory cells via said bit lines, and data in/out means for applying data signals to and receiving data signals from said memory cells, each memory cell comprising:

first transistor means, including a first semiconducting channel region, for effecting transistor action in said first semiconducting channel region to control current flow through said first semiconducting channel region;

ferroelectric transistor means, including a second semiconducting channel region, for effecting transistor action in said second semiconducting channel region to control current flow through said second semiconducting channel region, said ferroelectric transistor means further including a ferroelectric material capable of existing in a first polarization state and a second polarization state and a ferroelectric gate means for controlling said polarization state of said ferroelectric material; and second transistor means, including a third semiconducting channel region, for effecting transistor action in said third semiconducting channel region to control current flow through said third semiconducting channel region;

wherein said first, second, and third semiconducting channel regions are connected in series, each one of said word lines is electrically connected to said first transistor means and said second transistor means in one of said memory cells, said source of a plate voltage is electrically connected to said first semiconducting channel region in each of said memory cells, and each one of said bit lines is electrically connected to said third semiconducting channel in one of said memory cells.

17. A memory as in claim 16 wherein, in each of said memory cells, said first, second and third channel regions are contiguous portions of a single semiconducting channel.

18. A memory cell as in claim 17 wherein said first transistor means comprises a first transistor, said ferroelectric means comprises a ferroelectric transistor, and said second transistor means comprises a second transistor.

19. A memory as in claim 18 wherein:

said first transistor includes a first source/drain and a second source/drain;

said second transistor includes a first source/drain and a second source drain; and said ferroelectric transistor includes a first source/drain and a second source/drain; and wherein said first source/drain of said first transistor is connected to said source of a plate voltage, said second source/drain of said first transistor is connected to the first source/drain of said ferroelectric transistor, said first source/drain of said second transistor is connected to the second source/drain of said ferroelectric transistor, and said second source/drain of said second transistor is connected to said bit line connected to said memory cell.

20. A memory as in claim 16 wherein said memory further includes a sense amplifier electrically connectable to at least one of said bit lines, and a source of a reference voltage electrically connected to said sense amplifier, and wherein said reference voltage is less than said plate voltage.

21. A memory as in claim 16 wherein said plate voltage is from 20% to 50% of the coercive voltage of said ferroelectric material.

22. A memory as in claim 16 wherein said plate voltage is 0.5 volts or less.

23. A memory cell for a non-volatile integrated circuit memory, said memory cell comprising:

a semiconducting substrate;

a first doped region formed in said substrate, said doped region including a first portion, a second portion and a third portion connected in series;

a first conductor overlying said first portion of said first doped region;

a second conductor overlying said third portion of said first doped region;

a first insulator between said first conductor and said first portion of said first doped region and a second insulator between said second conductor and said third portion of said first doped region;

a ferroelectric member, a first portion of which overlies said first conductor, a second portion of which overlies said second portion of said first doped region, and a third portion of which overlies said second conductor; and a third conductor overlying said ferroelectric member.

24. A memory cell as in claim 23 and further including a third insulator between said first portion of said ferroelectric member and said first conductor and a fourth insulator between said third portion of said ferroelectric member and said second conductor.

25. A memory cell as in claim 24 wherein said first and second conductors comprise polysilicon and said third and fourth insulation layers comprise silicon dioxide.

26. A memory cell as in claim 23 and further including an isolation layer between said first portion of said ferroelectric member and said first conductor and between said third portion of said ferroelectric member and said second conductor.

27. A memory cell as in claim 26 wherein said isolation layer comprises $Si_3N_4$.

28. A memory cell as in claim 26 wherein said isolation layer comprises silicon dioxide.

29. A memory cell as in claim 23 wherein said ferroelectric member directly contacts said first conductor and said second conductor.

30. A memory cell as in claim 23 wherein said ferroelectric member directly contacts said second portion of said first doped region.

31. A memory cell as in claim 23 and further including a second doped region formed in said substrate, said second doped region being doped with a different type of dopant than said first doped region, said second doped region including first and second non-contiguous portions, said first portion of said second doped region contacting said first portion of said first doped region and said second portion of said second doped region contacting said third portion of said first doped region.

32. A memory cell for a non-volatile integrated circuit memory, said memory cell comprising:

a first pass gate transistor;

a second pass gate transistor; and a ferroelectric transistor electrically connected between said first pass gate transistor and said second pass gate transistor.

33. A memory cell as in claim 32 wherein each of said pass gate transistors include a first source/drain and a second source/drain, and said ferroelectric transistor is electrically connected between one of the source/drains of said first pass gate transistor and one of the source/drains of said second pass gate transistor.

34. A non-volatile integrated circuit memory comprising a plurality of bit lines, a plurality of word lines, a plurality of memory cells, a source of a plate voltage, row address means for applying signals to selected ones of said memory cells via said word lines, column address means for applying signals to selected ones of said memory cells via said bit lines, and data in/out means for applying data signals to and receiving data signals from said memory cells, each memory cell comprising:

a first pass gate transistor;

a second pass gate transistor; and a ferroelectric transistor electrically connected between said first pass gate transistor and said second pass gate transistor;

wherein each one of said word lines is electrically connected to said first pass gate transistor and said second pass gate transistor in one of said memory cells, said source of a plate voltage is electrically connected to said first pass gate transistor in each of said memory cells, and each one of said bit lines is electrically connected to said second pass gate transistor in each of said memory cells.

35. A memory as in claim 34 wherein said memory further includes a sense amplifier electrically connectable to at least one of said bit lines, and a source of a reference voltage electrically connected to said sense amplifier, and wherein said reference voltage is less than said plate voltage.

36. A memory as in claim 34 wherein said plate voltage is from 20% to 50% of the coercive voltage of said ferroelectric material.

37. A memory as in claim 34 wherein said plate voltage is 0.5 volts or less.

38. A ferroelectric memory comprising:

a memory cell including a ferroelectric device having a first logic state and a second logic state;

a bit line;

a sense amplifier;

first connecting means for electrically connecting said ferroelectric device to said bit line;

second connecting means for electrically connecting said bit line to said sense amplifier; and timing means connected to said first and second connecting means for: causing said first connecting means to connect said ferroelectric device to said bit line for a sufficient time to allow said bit line to assume a first voltage determined by the logic state of said ferroelectric device, causing said second connecting means to connect said sense amplifier to said bit line, and causing said first connecting means to disconnect said ferroelectric device from said bit line before said sense amplifier drives said bit line to a second voltage indicative of the logic state of said ferroelectric device.

39. A memory as in claim 38 wherein said first connecting means comprises a transistor means.

40. A memory as in claim 38 wherein said first voltage has a value of less than 50% of the coercive voltage of said ferroelectric device.

41. A memory as in claim 38 wherein said first voltage is 0.5 volts or less.

* * * * *